United States Patent
Lee et al.

(10) Patent No.: US 11,791,253 B2
(45) Date of Patent: Oct. 17, 2023

(54) DISPLAY DEVICE

(71) Applicant: SAMSUNG DISPLAY CO., LTD., Yongin-si (KR)

(72) Inventors: Seung Jun Lee, Hwaseong-si (KR); Myung Ho Lee, Anyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/403,853

(22) Filed: Aug. 16, 2021

(65) Prior Publication Data

US 2021/0375740 A1 Dec. 2, 2021

Related U.S. Application Data

(62) Division of application No. 16/520,018, filed on Jul. 23, 2019, now Pat. No. 11,127,667.

(30) Foreign Application Priority Data

Oct. 2, 2018 (KR) ........................ 10-2018-0117534

(51) Int. Cl.
*H05K 1/09* (2006.01)
*H05K 1/11* (2006.01)
(Continued)

(52) U.S. Cl.
CPC .... *H01L 23/49838* (2013.01); *H01L 23/4985* (2013.01); *H10K 59/131* (2023.02)

(58) Field of Classification Search
CPC . H05K 1/09; H05K 1/11; H05K 1/115; H05K 1/117; H05K 1/118; H05K 1/147;
(Continued)

(56) References Cited

U.S. PATENT DOCUMENTS 5,592,199 A * 1/1997 Kawaguchi ......... H01L 23/4985
345/206
6,052,172 A * 4/2000 Kajiwara ............... H05K 1/118
349/149
(Continued)

FOREIGN PATENT DOCUMENTS

KR 10-2003-0006202 1/2003
KR 10-2006-0119123 11/2006
(Continued)

*Primary Examiner* — Xiaoliang Chen
(74) *Attorney, Agent, or Firm* — F. CHAU & ASSOCIATES, LLC

(57) ABSTRACT

A display device comprises a pad terminal area and a first circuit board attached to the pad terminal area. The pad terminal area comprises a first pad terminal area having a first pad terminal row of first pad terminals and a second pad terminal area having a second pad terminal row of second pad terminals. The first circuit board comprises a first film having a first lead terminal row of first lead terminals and a second film having a second lead terminal row of second lead terminals. The first lead terminals are connected to the first pad terminals, the second lead terminals are connected to the second pad terminals, an end of the second film protrudes outward from an end of the first film, and the second pad terminal area overlaps an area between the end of the first film and the end of the second film.

10 Claims, 17 Drawing Sheets

(51) Int. Cl.
  *H05K 1/16* (2006.01)
  *G02F 1/167* (2019.01)
  *G02F 1/1339* (2006.01)
  *H01L 23/498* (2006.01)
  *H10K 59/131* (2023.01)

(58) Field of Classification Search
  CPC ...... H05K 1/189; H05K 1/016; H05K 1/0224;
    H05K 1/0237; H05K 1/0245; H05K
    1/0274; H05K 1/0296; H05K 1/038;
    H05K 3/323; H05K 3/361; H05K 3/363;
    H05K 3/4691; H01L 23/4985; H01L
    23/49811; H01L 23/49838; H01L 27/124;
    H01L 27/3241; H01L 27/3244; H01L
    27/3276; G02F 1/167; G02F 1/1339;
    G02F 1/13452; G02F 1/13454; G02F
    1/133385; G06F 3/0412; G06F 3/0445;
    G06F 3/0446; G06F 3/0464; G06F
    3/04164
  USPC ........... 361/749; 257/88, 734; 174/254, 261;
    345/87, 173, 204, 206; 349/149, 152
  See application file for complete search history.

(56) References Cited

U.S. PATENT DOCUMENTS

| | | | | |
|---|---|---|---|---|
| 6,211,936 B1* | 4/2001 | Nakamura | ............. | H05K 3/361 |
| | | | | 349/149 |
| 9,960,132 B1 | 5/2018 | Chen et al. | | |
| 10,373,927 B2* | 8/2019 | Tsukao | ............. | H01L 23/49811 |
| 10,488,720 B2* | 11/2019 | Choi | ...................... | H01L 24/32 |
| 10,818,734 B2* | 10/2020 | Park | ...................... | H01L 51/5253 |
| 11,127,667 B2* | 9/2021 | Lee | ................... | H01L 23/49838 |
| 2004/0060969 A1* | 4/2004 | Imai | ...................... | H05K 3/363 |
| | | | | 228/180.21 |
| 2004/0108594 A1* | 6/2004 | Toyosawa | ............. | H01L 21/563 |
| | | | | 257/734 |
| 2005/0194678 A1* | 9/2005 | Chuang | ............. | H01L 23/49838 |
| | | | | 257/E23.068 |
| 2005/0253270 A1* | 11/2005 | Sasaki | ................. | H01L 41/0477 |
| | | | | 257/758 |
| 2008/0001619 A1* | 1/2008 | Igarashi | ...................... | H01J 9/42 |
| | | | | 324/756.01 |
| 2008/0179085 A1 | 7/2008 | Choi et al. | | |
| 2009/0207367 A1* | 8/2009 | Oohira | ................. | H05K 1/0219 |
| | | | | 349/150 |
| 2011/0279423 A1* | 11/2011 | Ohno | ...................... | G02F 1/13452 |
| | | | | 345/204 |
| 2012/0199382 A1* | 8/2012 | Imai | ...................... | H05K 1/0224 |
| | | | | 174/254 |
| 2013/0057635 A1* | 3/2013 | Inokuma | ................ | B41J 2/3353 |
| | | | | 347/197 |
| 2013/0093990 A1* | 4/2013 | Chen | ...................... | H05K 1/117 |
| | | | | 349/150 |
| 2013/0264593 A1* | 10/2013 | Nagami | ................ | H01L 27/124 |
| | | | | 257/88 |
| 2013/0335940 A1* | 12/2013 | Matsui | ...................... | H05K 1/18 |
| | | | | 361/783 |
| 2014/0102763 A1* | 4/2014 | Lin | ...................... | H05K 3/4691 |
| | | | | 174/250 |
| 2014/0232954 A1* | 8/2014 | Suzuki | ................ | G02F 1/13338 |
| | | | | 349/12 |
| 2015/0103500 A1* | 4/2015 | Bae | ...................... | H05K 1/111 |
| | | | | 228/102 |
| 2015/0212538 A1* | 7/2015 | Lee | ...................... | G06F 3/04164 |
| | | | | 345/173 |
| 2015/0226995 A1* | 8/2015 | Aota | ...................... | H01L 24/29 |
| | | | | 349/149 |
| 2015/0228706 A1* | 8/2015 | Lee | ...................... | H05K 1/117 |
| | | | | 257/88 |
| 2015/0288706 A1 | 10/2015 | Marshall | | |
| 2016/0026052 A1* | 1/2016 | Ogasawara | ......... | G02F 1/13458 |
| | | | | 349/33 |
| 2016/0195969 A1* | 7/2016 | Kim | ...................... | G06F 3/04164 |
| | | | | 345/173 |
| 2016/0212823 A1* | 7/2016 | Kim | ...................... | H05B 33/06 |
| 2016/0218053 A1* | 7/2016 | Cho | ...................... | H01L 24/00 |
| 2016/0286649 A1* | 9/2016 | Choi | ...................... | H05K 1/147 |
| 2016/0306488 A1* | 10/2016 | Kim | ...................... | G06F 1/1643 |
| 2017/0127512 A1* | 5/2017 | Park | ...................... | H05K 1/118 |
| 2017/0135209 A1* | 5/2017 | Kim | ...................... | H05K 1/11 |
| 2017/0141498 A1* | 5/2017 | Ryu | ...................... | H02G 11/003 |
| 2017/0148702 A1* | 5/2017 | Funayama | ............ | G06F 3/0445 |
| 2017/0164474 A1* | 6/2017 | Kim | ...................... | H05K 1/181 |
| 2017/0186829 A1* | 6/2017 | Yamazaki | ........... | H01L 27/3262 |
| 2017/0332495 A1* | 11/2017 | Kim | ...................... | G09G 3/2092 |
| 2018/0011537 A1* | 1/2018 | Agari | ...................... | G06F 3/016 |
| 2018/0082929 A1* | 3/2018 | Lai | ...................... | H05K 1/0393 |
| 2018/0090442 A1 | 3/2018 | Li et al. | | |
| 2018/0212009 A1* | 7/2018 | Odaka | ...................... | H10K 50/11 |
| 2018/0217465 A1* | 8/2018 | Nagata | ................ | H01L 27/124 |
| 2018/0228037 A1* | 8/2018 | Fujikawa | ............ | G02F 1/13452 |
| 2018/0233436 A1* | 8/2018 | Lee | ...................... | H01L 23/3114 |
| 2018/0286939 A1* | 10/2018 | Lee | ...................... | G09G 3/006 |
| 2019/0041681 A1* | 2/2019 | Lai | ...................... | G02F 1/133528 |
| 2019/0041685 A1* | 2/2019 | Murakami | ........... | H10K 59/129 |
| 2019/0059156 A1* | 2/2019 | Kwon | ...................... | H05K 1/111 |
| 2019/0123071 A1* | 4/2019 | Kim | ...................... | H01L 27/1218 |
| 2019/0229174 A1* | 7/2019 | Choi | ...................... | H10K 59/1315 |
| 2019/0310302 A1* | 10/2019 | Lee | ...................... | G06F 3/0443 |
| 2020/0105657 A1 | 4/2020 | Lee et al. | | |
| 2021/0129515 A1* | 5/2021 | Hirano | ................ | G02F 1/1339 |

FOREIGN PATENT DOCUMENTS

| | | |
|---|---|---|
| KR | 10-2007-0079484 | 8/2007 |
| KR | 10-2009-0062078 | 6/2009 |
| KR | 10-2016-0046602 | 4/2016 |
| KR | 10-2017-0080893 | 7/2017 |

\* cited by examiner

DISPLAY DEVICE

This application is a divisional of U.S. application Ser. No. 16/520,018, filed on Jul. 23, 2019 in the U.S. Patent and Trademark Office, which claims priority under 35 U.S.C. § 119 from, and the benefit of, Korean Patent Application No. 10-2018-0117534, filed on Oct. 2, 2018 in the Korean Intellectual Property Office, the contents of both of which are herein incorporated by reference in their entireties.

BACKGROUND

1. Technical Field

Embodiments of the present disclosure are directed to a display device, and more particularly, to a display device that includes a driver integrated circuit.

2. Discussion of the Related Art

With the development of multimedia applications, display devices are becoming increasingly important and more diverse in their uses. For example, display devices are part of portable electronic devices such as smartphones, smart watches, tablet PCs and notebook computers, as well as large-sized electronic devices such as televisions, monitors and digital information displays.

In particular, display devices that have high resolution are becoming an essential technology in the display market with the development of image media. For example, a high resolution of 4K ultra-high definition (UHD) to 8K quad-ultra-high definition (QUHD) is being used in the television market. A high-resolution display device requires a multi-channel driver integrated circuit.

Examples of a driver integrated circuit include a data driver integrated circuit and a gate driver integrated circuit. A data driver integrated circuit generates data signals, and a gate driver integrated circuit generates scan signals. The data driver integrated circuit and the gate driver integrated circuit respectively transmit the generated data signals and the generated scan signals to pixels of a display panel. A driver integrated circuit, in particular, may be in the form of a driver chip. For example, a data driver chip may be coupled to the display panel by a chip-on-film (COF) method. For another example, the data driver chip may be directly attached to the display panel by a chip-on-glass (COG) or a chip-on-plastic (COP) method.

Offering a high resolution QUHD, however, faces many constraints, such as data pitch because the number of lead terminals disposed on a film, to which a multi-channel data driver integrated circuit is connected by a COF method, is increased.

SUMMARY

Embodiments of the present disclosure can provide a flexible printed circuit film that accommodates multiple channels of a data driver integrated circuit, the flexible printed circuit film including a flexible printed circuit board which includes a first film and a second film disposed on a surface of the first film and that has a portion protruding further than a side of the first film, wherein lead terminals forming at least two rows are disposed in the protruding portion.

However, embodiments of the present disclosure are not restricted to those set forth herein. The above and other embodiments of the present disclosure will become more apparent to one of ordinary skill in the art to which embodiments of the present disclosure pertains by referencing the detailed description of the present disclosure given below.

According to an embodiment of the present disclosure, there is provided a display device that comprises a display panel which comprises a display area and a pad terminal area disposed adjacent to the display area, and a first circuit board which is attached to the pad terminal area of the display panel. The pad terminal area comprises a first pad terminal area that has at least one first pad terminal row in which one or more first pad terminals are arranged along a first direction and a second pad terminal area that has at least one second pad terminal row in which one or more second pad terminals are arranged along the first direction. The first circuit board comprises a first film that has at least one first lead terminal row in which one or more first lead terminals are arranged along the first direction and a second film that has at least one second lead terminal row in which one or more second lead terminals are arranged along the first direction. The first lead terminals are connected to the first pad terminals, the second lead terminals are connected to the second pad terminals, a first end of the second film protrudes from a first end of the first film toward the display area, and the second pad terminal area overlaps an area between the first end of the first film and the first end of the second film.

The first pad terminal row may comprise a first sub-pad terminal row and a second sub-pad terminal row which are spaced apart from each other in a second direction intersecting the first direction, and the second sub-pad terminal row may comprise a third sub-pad terminal row and a fourth sub-pad terminal row which are spaced apart from each other in the second direction. The first pad terminals of the first sub-pad terminal row and the second sub-pad terminal row may be staggered, and the second pad terminals of the third sub-pad terminal row and the fourth sub-pad terminal row may be staggered.

The first lead terminal row may comprise a first sub-lead terminal row and a second sub-lead terminal row which are spaced apart from each other in the second direction, and the second lead terminal row may comprise a third sub-lead terminal row and a fourth sub-lead terminal row which are spaced apart from each other in the second direction. The first lead terminals of the first sub-lead terminal row and the second sub-lead terminal row may be staggered, and the second lead terminals of the third sub-lead terminal row and the fourth sub-lead terminal row may be staggered.

The first circuit board may further comprise a driver integrated circuit disposed on a first surface of the first film.

The first circuit board may further comprise first signal wirings disposed on the first surface of the first film and that connect the driver integrated circuit to the first lead terminals.

The second lead terminals may be disposed on a first surface of the second film, and the first circuit board may further comprise an insulating layer disposed between a second surface of the first film and the first surface of the second film.

The first circuit board may further comprise contact holes that penetrate through the first film and the insulating layer. The contact holes may overlap the driver integrated circuit.

The first circuit board may further comprise second signal wirings disposed on the first surface of the second film and that connect the contact holes to the second lead terminals.

The second signal wirings may be disposed in a different plane from the first signal wirings.

The second signal wirings may be insulated from the first lead terminals and the first signal wirings by the insulating layer.

The contact holes may form a plurality of rows on the first circuit board, and the contact holes in different rows may be staggered.

A distance between the first surface of the second film and the second pad terminals that face the first surface of the second film may be greater than a distance between the first surface of the first film and the first pad terminals that face the first surface of the first film.

A thickness of the second lead terminals may be greater than that of the first lead terminals.

The display device may further comprise a second circuit board which comprises a first circuit pad terminal area and a second circuit pad terminal area. The first circuit pad terminal area comprises at least one first circuit pad terminal row in which one or more first circuit pad terminals are arranged along the first direction and is attached to the first surface of the first film on a side opposite a side where the at least one first lead terminal row is disposed. The second circuit pad terminal area comprises at least one second circuit pad terminal row in which one or more second circuit pad terminals are arranged along the first direction and is attached to the first surface of the second film on a side opposite a side where the at least one second lead terminal row is disposed.

The first film of the first circuit board may have at least one third lead terminal row in which one or more third lead terminals are arranged along the first direction, and the second film has at least one fourth lead terminal row in which one or more fourth lead terminals are arranged along the first direction. The third lead terminals are connected to the first circuit pad terminals, the fourth lead terminals are connected to the second circuit pad terminals, a second end of the second film that is opposite from the first end of the second film protrudes outward from a second end of the first film that is opposite from the first end of the first film, and the second circuit pad terminal area is disposed between the second end of the first film and the second end of the second film.

According to another embodiment of the present disclosure, there is provided a flexible printed circuit film. The flexible printed circuit board comprises a first film that includes at least one first lead terminal row in which one or more first lead terminals are arranged along a first direction; a second film disposed on the first film and that includes at least one second lead terminal row in which one or more second lead terminals are arranged along the first direction; and an insulating layer disposed between the first film and the second film. An end of the second film protrudes outward from an end of the first film, and the second lead terminals are disposed between the end of the second film and the end of the first film.

The circuit board may further comprise a driver integrated circuit disposed on the first film; contact holes that overlap the driver integrated circuit and that penetrate through the first film and the insulating layer; first signal wirings that connect the driver integrated circuit to the first lead terminals; and second signal wirings that connect the contact holes to the second lead terminals. The second signal wirings may be insulated from the first lead terminals and the first signal wirings by the insulating layer.

A thickness of the second lead terminals may be greater than that of the first lead terminals.

According to another embodiment of the present disclosure, there is provided a display device, comprising a display panel that comprises a display area and a pad terminal area disposed adjacent to the display area. The pad terminal area comprises a first pad terminal area that has at least one first pad terminal row in which one or more first pad terminals are arranged along a first direction and a second pad terminal area that has at least one second pad terminal row in which one or more second pad terminals are arranged along the first direction. The first pad terminal row comprises a first sub-pad terminal row and a second sub-pad terminal row which are spaced apart from each other in a second direction intersecting the first direction, the second sub-pad terminal row comprises a third sub-pad terminal row and a fourth sub-pad terminal row which are spaced apart from each other in the second direction. The first pad terminals of the first sub-pad terminal row and the second sub-pad terminal row are staggered, and the second pad terminals of the third sub-pad terminal row and the fourth sub-pad terminal row are staggered.

The display device may further comprise a first circuit board that is attached to the pad terminal area of the display panel. The first circuit board may comprise a first film that has at least one first lead terminal row in which one or more first lead terminals are arranged along the first direction and a second film that has at least one second lead terminal row in which one or more second lead terminals are arranged along the first direction. The first lead terminal row may comprise a first sub-lead terminal row and a second sub-lead terminal row which are spaced apart from each other in the second direction, and the second lead terminal row may comprise a third sub-lead terminal row and a fourth sub-lead terminal row which are spaced apart from each other in the second direction. The first lead terminals of the first sub-lead terminal row and the second sub-lead terminal row may be staggered, and the second lead terminals of the third sub-lead terminal row and the fourth sub-lead terminal row may be staggered. The first lead terminals may be connected to the first pad terminals, the second lead terminals may be connected to the second pad terminals, a first end of the second film may protrude from a first end of the first film toward the display area, and the second pad terminal area may overlaps an area between the first end of the first film and the first end of the second film.

DETAILED DESCRIPTION

Figure 1:
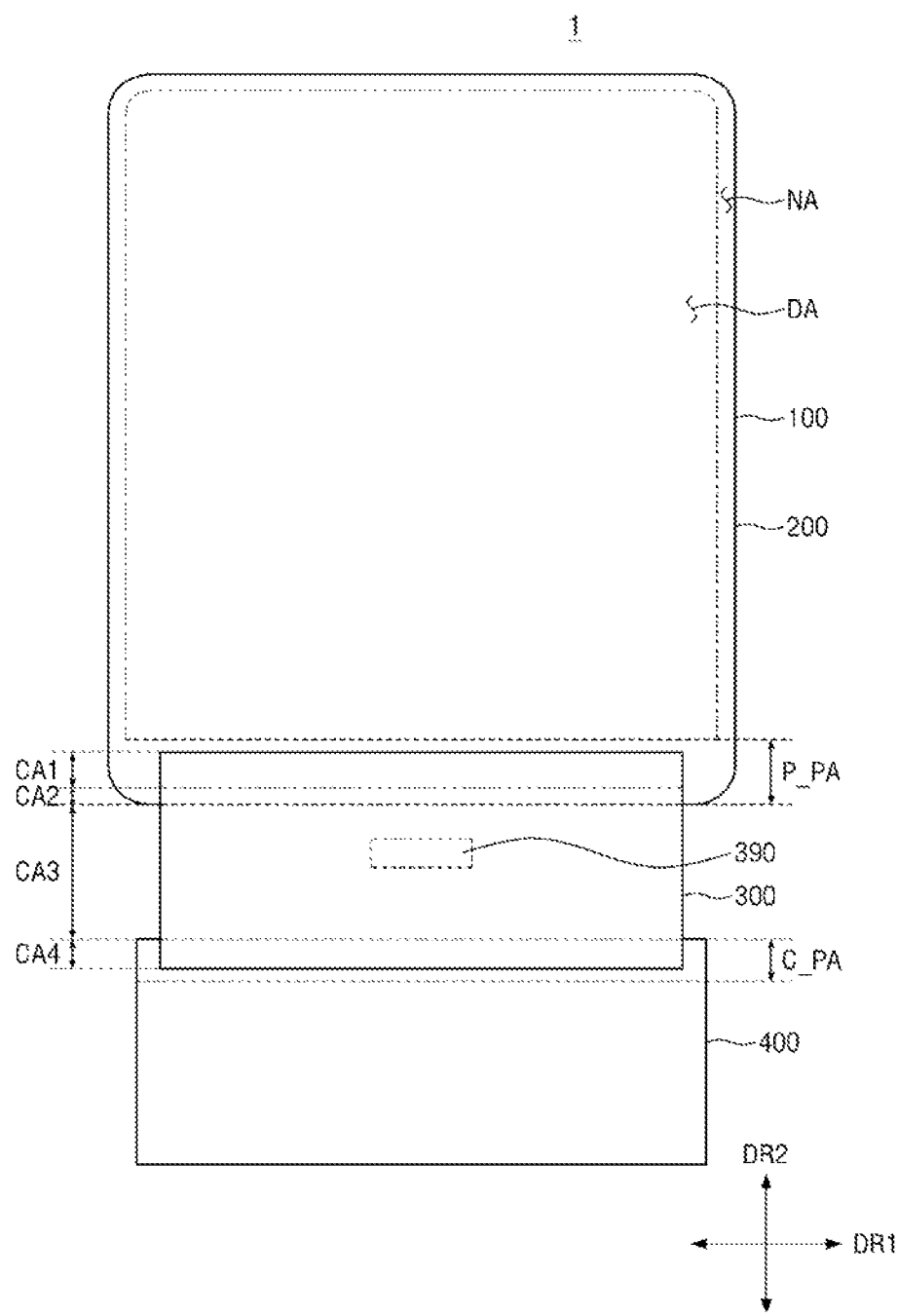
FIG. 1 is a plan layout view of a display device according to an embodiment.

FIG. 1 is a plan layout view of a display device 1 according to an embodiment.

Referring to FIG. 1, according to an embodiment, the display device 1 includes a display panel 100 that displays an image, an under-panel sheet 200 disposed under the display panel 100, a first circuit board 300 connected to the display panel 100, and a second circuit board 400 connected to the first circuit board 300 and attached to a lower surface of the under-panel sheet 200.

The display panel 100 may be, for example, an organic light emitting display panel. In the following embodiments, a case in which the display panel 100 is an organic light emitting display panel will be described as an example. However, the display panel 100 may be one of various other types of display panels, such as a liquid crystal display (LCD) panel, a quantum-dot organic light emitting display (QD-OLED) panel, a quantum-dot LCD (QD-LCD) panel, a quantum-nano light emitting display (QNED) panel, or a micro light emitting diode (LED) display panel.

According to an embodiment, the display panel 100 includes a display area DA for displaying an image and a non-display area NA disposed around the display area DA. The display area DA is shaped in a plan view like a rectangle with right-angled corners or a rectangle with rounded corners. However, embodiments the present disclosure are not limited thereto, and the planar shape of the display area DA may also be a circle, an ellipse, or various other shapes. The non-display area NA is disposed adjacent to both short sides and both long sides of the display area DA. In this case, the non-display area NA surrounds all sides of the display area DA and forms edges of the display area DA. However, embodiments the present disclosure are not limited to this case, and the non-display area NA may also be disposed adjacent to only both short sides or both long sides of the display area DA.

According to an embodiment, the non-display area NA further includes a panel pad area P_PA on a side of the display panel 100 in a second direction DR2. The display panel 100 includes a plurality of panel pad terminals P_PE (see FIG. 2). The panel pad terminals P_PE are disposed in the panel pad area P_PA.

According to an embodiment, the first circuit board 300 is disposed on an upper surface of the panel pad area P_PA of the display panel 100. The first circuit board 300 is connected to the upper surface of the panel pad area P_PA.

According to an embodiment, the first circuit board 300 includes first and second circuit areas CA1 and CA2 which are attached to the panel pad area P_PA, a third circuit area CA3 in which a data driver integrated circuit 390 is disposed, and a fourth circuit area CA4 which is attached to a circuit pad area C_PA of the second circuit board 400 to be described below. The first circuit board 300 includes a plurality of lead terminals LE (see FIG. 2). As used herein, a lead terminal refers to a wiring which is connected to a signal wiring of a display panel, not to the material from the wiring is made.

According to an embodiment, the lead terminals LE may be disposed in the first and second circuit areas CA1 and CA2.

According to an embodiment, the first circuit board 300 includes the data driver integrated circuit 390 disposed on a first surface of the first circuit board 300. The data driver integrated circuit 390 is mounted on the first circuit board 300 in the form of a driver chip.

Although one first circuit board 300 is connected to the display panel 100 in FIG. 1, embodiments of the present disclosure are not limited to this case. For example, a plurality of first circuit boards 300 can be connected to the display panel 100. In this case, the first circuit boards 300 are spaced apart from each other in a direction.

According to an embodiment, the second circuit board 400 is disposed on the fourth circuit area CA4 of the first circuit board 300. Although the second circuit board 400 is illustrated as being disposed on a second surface of the first circuit board 300 in the drawing, embodiments of the present disclosure are not limited to this case, and the second circuit board 400 may also be disposed on the first surface of the first circuit board 300.

According to an embodiment, the second circuit board 400 includes the circuit pad area C_PA attached to the fourth circuit area CA4 of the first circuit board 300. The second circuit board 400 includes circuit pad terminals C_PE (see FIG. 2) disposed in the circuit pad area C_PA.

According to an embodiment, a configuration of the display panel 100, the first circuit board 300, and the second circuit board 400 will now be described.

Figure 2:
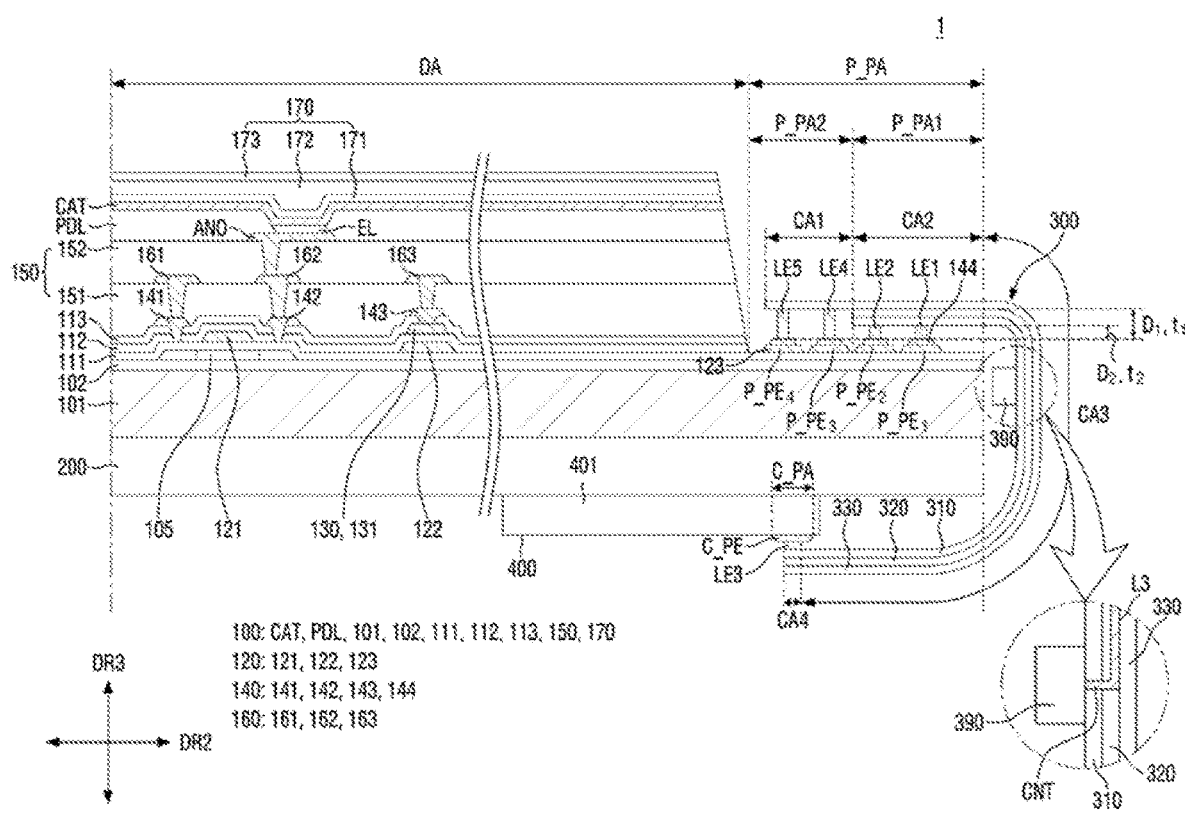
FIG. 2 is a cross-sectional view of a display device according to an embodiment.
Figure 3:
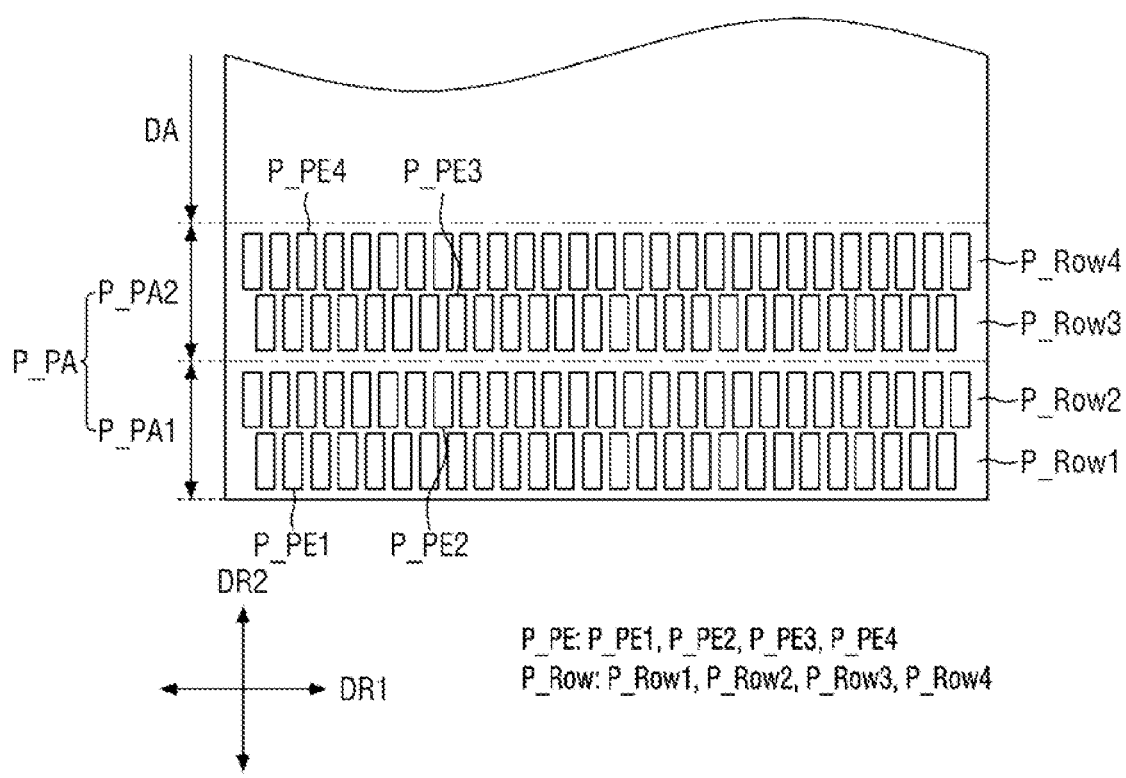
FIG. 3 is a plan layout view of a panel pad area according to an embodiment.
Figure 4:
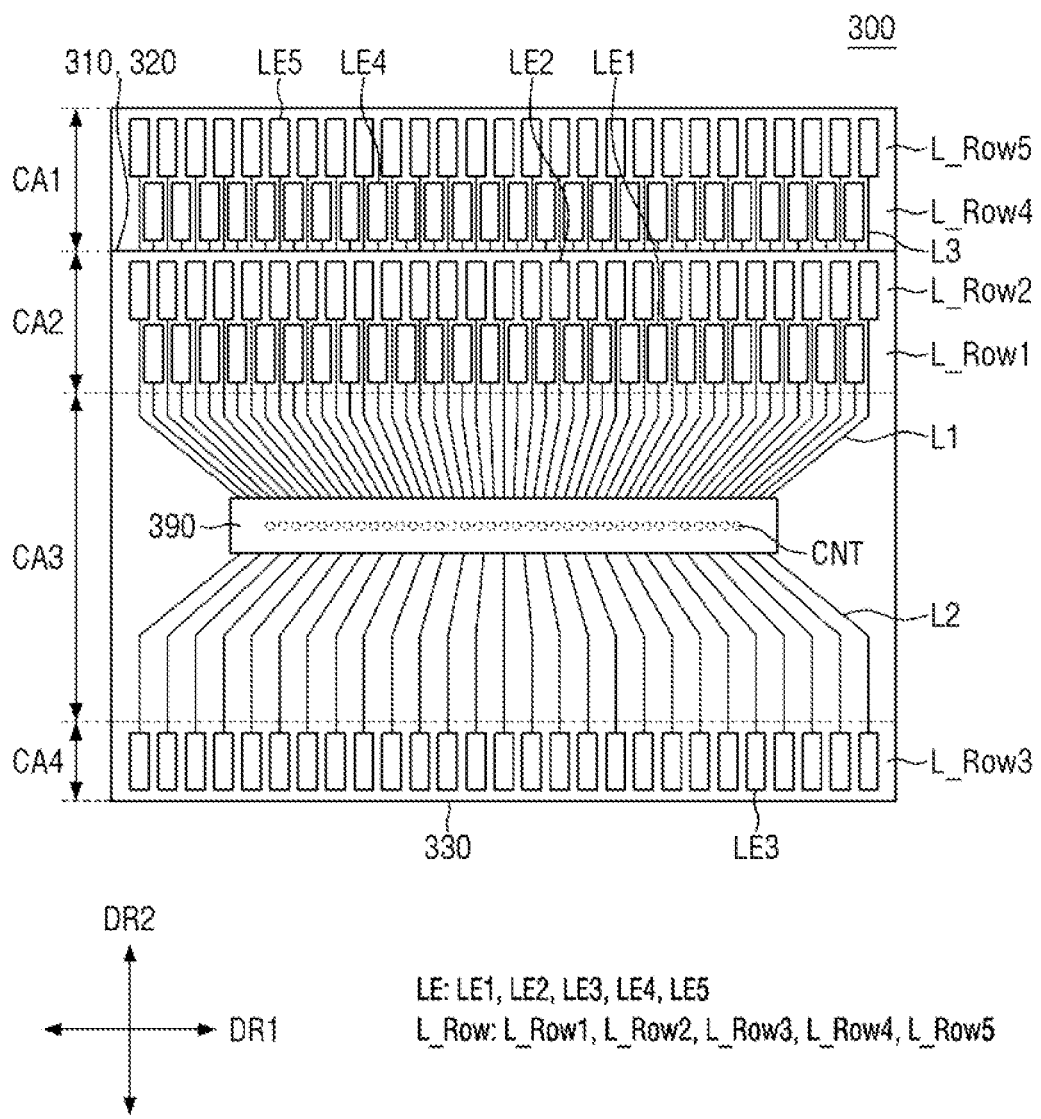
FIG. 4 is a plan layout view of a first circuit board according to an embodiment.
Figure 5:
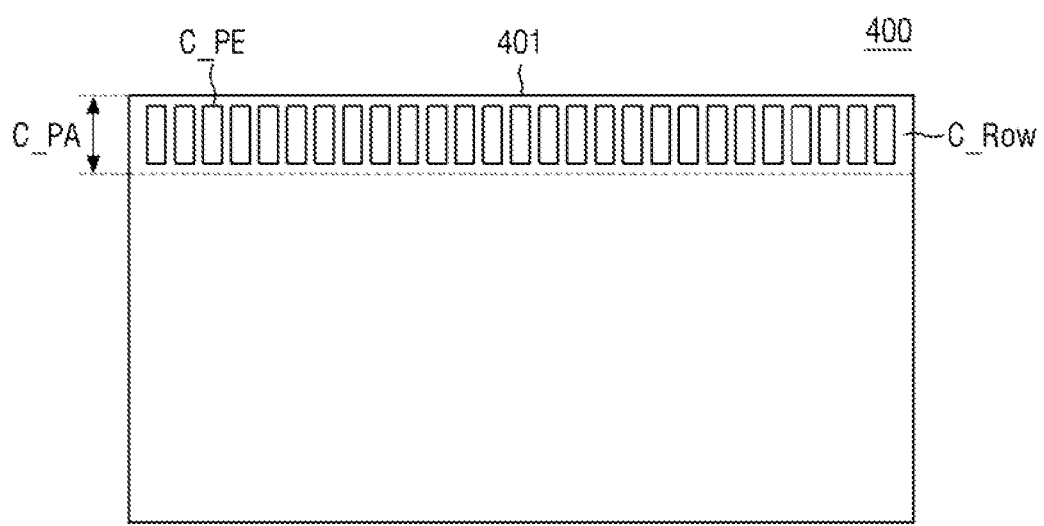
FIG. 5 is a plan view of a second circuit board according to an embodiment.
Figure 5:
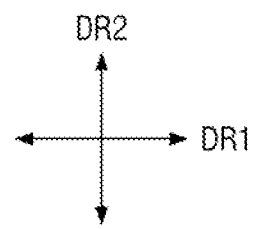

FIG. 2 is a cross-sectional view of the display device 1 according to an embodiment. FIG. 3 is a plan layout view of a panel pad area P_PA according to an embodiment. FIG. 4 is a plan layout view of a first circuit board 300 according to an embodiment. FIG. 5 is a plan view of a second circuit board 400 according to an embodiment.

FIG. 2 illustrates a cross-sectional shape of one pixel area and the panel pad area P_PA of FIG. 1.

Referring to FIGS. 2 through 5, according to an embodiment, the under-panel sheet 200 is disposed under the display panel 100.

According to an embodiment, the under-panel sheet 200 includes at least one functional layer. The functional layer may be a layer performing a heat dissipating function, an electromagnetic wave shielding function, a grounding function, a buffering function, a strength enhancing function, a support function or a digitizing function. The functional layer may be a sheet layer made of a sheet, a film layer made of a film, a thin layer, a coating layer, a panel, a plate, or etc. One functional layer may be a single layer, but may also be a stack of a plurality of thin layers or coating layers. Examples of the functional layer include a support base material, a heat dissipating layer, an electromagnetic wave shielding layer, a shock absorbing layer, or a digitizer. The second circuit board 400 to be described below is attached to the lower surface of the under-panel sheet 200.

According to an embodiment, the display panel 100 includes a base substrate 101, a plurality of conductive layers, a plurality of insulating layers that insulate the conductive layers, and an organic layer EL.

According to an embodiment, the base substrate 101 is disposed over the display area DA and the non-display area NA. The base substrate 101 supports various elements disposed on the base substrate 101. In an embodiment, the base substrate 101 is a rigid substrate that contains a rigid material such as soft glass or quartz. In another embodiment, the base substrate 101 is a semi-flexible substrate that partially contains a ductile material or may be a flexible substrate. In this case, the base substrate 101 may include polyethylene terephthalate (PET), polyimide (PI), polycarbonate (PC), polyethylene (PE), polypropylene (PP), polysulfone (PSF), polymethyl methacrylate (PMMA), triacetyl cellulose (TAC), or cyclo olefin polymer (COP).

According to an embodiment, a buffer layer 102 is disposed on the base substrate 101. The buffer layer 102 prevents moisture and oxygen from being introduced from the outside through the base substrate 101. In addition, the buffer layer 102 planarizes a surface of the base substrate 101. In an embodiment, the buffer layer 102 may include any one of a silicon nitride (SiNx) layer, a silicon oxide (SiO$_2$) layer, or a silicon oxynitride (SiOxNy) layer.

According to an embodiment, a semiconductor layer 105 is disposed on the buffer layer 102. The semiconductor layer 105 forms a channel of a thin-film transistor TFT. The semiconductor layer 105 is disposed in each pixel of the display area DA and, in some cases, is also disposed in the non-display area NA. The semiconductor layer 105 includes source/drain regions and an active region. The semiconductor layer 105 includes polycrystalline silicon.

According to an embodiment, a first insulating layer 111 is disposed on the semiconductor layer 105. The first insulating layer 111 is disposed on the entire surface of the base substrate 101. The first insulating layer 111 is a gate insulating layer that has a gate insulating function. The first insulating layer 111 may include a silicon compound, a metal oxide, or etc. For example, the first insulating layer 111 may include silicon oxide, silicon nitride, silicon oxynitride, aluminum oxide, tantalum oxide, hafnium oxide, zirconium oxide, titanium oxide, etc. These materials may be used alone or in combination with each other.

According to an embodiment, a first conductive layer 120 is disposed on the first insulating layer 111. The first conductive layer 120 includes a gate electrode 121 of the thin-film transistor TFT and a plurality of first pad electrodes 123. The first conductive layer 120 includes a metal. The first conductive layer 120 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu).

According to an embodiment, a second insulating layer 112 is disposed on the first conductive layer 120. The second insulating layer 112 insulates the first conductive layer 120 from a second conductive layer 130. The second insulating layer 112 is made of a material selected from the materials disclosed as examples of the material of the first insulating layer 111.

According to an embodiment, the second conductive layer 130 is disposed on the second insulating layer 112. The second conductive layer 130 includes a first electrode 131 of a storage capacitor Cst. The second conductive layer 130 may be made of a material selected from the materials mentioned as examples of the material of the first conductive layer 120.

According to an embodiment, a third insulating layer 113 is disposed on the second conductive layer 130. The third insulating layer 113 includes a material selected from the materials disclosed as examples of the material of the first insulating layer 111.

According to an embodiment, a third conductive layer 140 is disposed on the third insulating layer 113. The third conductive layer 140 includes a source electrode 141, a drain electrode 142, a power supply voltage electrode 143, and a plurality of second pad electrodes 144. The third conductive layer 140 includes a material selected from the materials disclosed as examples of the material of the first conductive layer 120.

According to an embodiment, each second pad electrode 144 is disposed on an upper surface of a corresponding first pad electrode 123. Each first pad electrode 123 and each second pad electrode 144 overlap each other and constitute a panel pad terminal P_PE.

According to an embodiment, a planar shape of the panel pad terminal P_PE is determined by an outer protruding profile in a plan view. In an embodiment, side surfaces of the first and second pad electrodes 123 and 144 are tapered and aligned with each other. In this case, a lower surface of the first pad electrode 123 protrudes further outward than a lower surface of the second pad electrode 144. Therefore, the planar shape of the panel pad terminal P_PE is determined by the outer profile of the first pad electrode 123. In another embodiment, the side surfaces of the first and second pad electrodes 123 and 144 are not tapered, and the side surfaces of the second pad electrode 144 may be recessed inward from the side surfaces of the first pad electrode 123 or may protrude further outward than the side surfaces of the first pad electrode 123. In this case, since the planar shape of the panel pad terminal P_PE is determined by the outer protruding profile in a plan view, it can be variously modified.

As described above, according to an embodiment, the third insulating layer 113 is disposed on the second conductive layer 130. Structures, such as the third insulating layer 113, disposed on the second conductive layer 130 are removed from the panel pad area P_PA. Therefore, the removed structures expose the panel pad terminals P_PE disposed in the panel pad area P_PA. The lead terminals LE are coupled to the exposed panel pad terminals P_PE. In an embodiment, the coupling is achieved by an anisotropic conductive film (ACF) interposed between each lead terminal LE and each panel pad terminal P_PE. In other embodiments, each lead terminal LE and each panel pad terminal P_PE are directly coupled to each other by ultrasonic bonding without an element or layer interposed between them.

According to an embodiment, a first via layer 151 is disposed on the third conductive layer 140. The first via layer 151 includes an organic insulating material, such as polyacrylates resin, epoxy resin, phenolic resin, polyamides resin, polyimides resin, unsaturated polyesters resin, polyphenylenethers resin, polyphenylenesulfides resin or benzocyclobutene (BCB).

According to an embodiment, a fourth conductive layer 160 is disposed on the first via layer 151. The fourth conductive layer 160 includes power supply voltage lines 161 and 163 and a connection electrode 162. The power supply voltage line 161 is electrically connected to the source electrode 141 of the thin-film transistor TFT through a contact hole passing through the first via layer 151. The connection electrode 162 is electrically connected to the drain electrode 142 of the thin-film transistor TFT through a contact hole passing through the first via layer 151. The power supply voltage line 163 is electrically connected to the power supply voltage electrode 143 through a contact hole passing through the first via layer 151.

According to an embodiment, the fourth conductive layer 160 includes one or more metals selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), or molybdenum (Mo). The fourth conductive layer 160 may be a single layer, or may have a multilayered structure. For example, the fourth conductive layer 160 may have a stacked structure of Ti/Al/Ti, Mo/Al/Mo, Mo/AlGe/Mo, or Ti/Cu.

According to an embodiment, a second via layer 152 is disposed on the fourth conductive layer 160. The second via layer 152 includes a material selected from the materials disclosed as examples of the material of the first via layer 151. That is, the second via layer 152 includes an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

According to an embodiment, an anode ANO is disposed on the second via layer 152. The anode ANO is electrically connected to the connection electrode 162 through a contact hole passing through the second via layer 152.

According to an embodiment, a pixel defining layer PDL is disposed on the anode ANO. The pixel defining layer PDL includes an opening that exposes the anode ANO. The pixel defining layer PDL may be made of an organic insulating material or an inorganic insulating material. In an embodiment, the pixel defining layer PDL includes a material such as a photoresist, a polyimide resin, an acrylic resin, a silicon compound, or a polyacrylic resin.

According to an embodiment, the organic layer EL is disposed on an upper surface of the anode ANO and in the opening of the pixel defining layer PDL. A cathode CAT is disposed on the organic layer EL and the pixel defining layer PDL. The cathode CAT is a common electrode disposed over a plurality of pixels.

According to an embodiment, a thin-film encapsulation layer 170 is disposed on the cathode CAT. The thin-film encapsulation layer 170 covers an organic light emitting diode OLED. The thin-film encapsulation layer 170 is a layer in which an inorganic layer and an organic layer are alternately stacked. For example, the thin-film encapsulation layer 170 includes a first inorganic layer 171, an organic layer 172, and a second inorganic layer 173 that are stacked sequentially.

According to an embodiment, the panel pad area P_PA described above includes a first panel pad area P_PA1 and a second panel pad area P_PA2. The first panel pad area P_PA1 is disposed adjacent to an end of the display panel 100. The second panel pad area P_PA2 may be disposed between the first panel pad area P_PA1 and the display area DA.

According to an embodiment, the panel pad terminals P_PE described above include first through fourth panel pad terminals P_PE$_1$ through P_PE$_4$.

The first and second panel pad terminals P_PE$_1$ and P_PE$_2$ are disposed in the first panel pad area P_PA1. The third and fourth panel pad terminals P_PE$_3$ and P_PE$_4$ may be disposed in the second panel pad area P_PA2. The first panel pad terminals P_PE$_1$ are disposed adjacent to the end of the display panel 100. The second panel pad terminals P_PE$_2$ are disposed between the first panel pad terminals P_PE$_1$ and the second panel pad area P_PA2. The third panel pad terminals P_PE$_3$ are disposed adjacent to the first panel pad area P_PA1 or the second panel pad terminals P_PE$_2$. The fourth panel pad terminals P_PE$_4$ are disposed adjacent to the display area DA.

Referring to FIG. 3, according to an embodiment, the first through fourth panel pad terminals P_PE$_1$ through P_PE$_4$ are arranged in a first direction DR1 to form rows.

According to an embodiment, the first panel pad terminals P_PE$_1$ form a first panel pad row P_ROW1, the second panel pad terminals P_PE$_2$ form a second panel pad row P_ROW2, the third panel pad terminals P_PE$_3$ form a third panel pad row P_ROW3, and the fourth panel pad terminals P_PE$_4$ form a fourth pad row P_ROW4.

Specifically, according to an embodiment, the first panel pad row P_ROW1 is disposed adjacent to an end of the display panel 100. The second panel pad row P_ROW2 is disposed between the first panel pad row P_ROW1 and the second panel pad area P_PA2. The third panel pad row P_ROW3 is disposed adjacent to the first panel pad area P_PA1. The fourth panel pad row P_ROW4 is disposed adjacent to the display area DA.

According to an embodiment, the first through fourth panel pad rows P_ROW1 through P_ROW4 are staggered.

As used herein, the term 'staggered' refers to placing at least one pad terminal P_PE between two closest pad terminals of an adjacent row P_ROW. For example, one pad terminal P_PE is placed between the two pad terminals of the adjacent row P_ROW in the first direction DR1.

According to an embodiment, if this arrangement method is applied, two pad terminals are each disposed diagonal to one pad terminal of an adjacent row. For example, one of the two pad terminals is located in a lower-left diagonal direction from the one pad terminal, and the other one of the two pad terminals is located in a lower-right diagonal direction from the one pad terminal. Alternatively, one of the two pad terminals is located in an upper-left diagonal direction from the one pad terminal, and the other one of the two pad terminals is located in an upper-right diagonal direction from the one pad terminal.

In this case, according to an embodiment, a center line that extends from a central area of the one pad terminal is located between center lines that respectively extend from central areas of the two pad terminals.

According to an embodiment, a pad terminal of one pad row overlaps two closest pad terminals of an adjacent row. For example, a first side surface of the pad terminal is located further to the left than a first side surface of a pad terminal located in the lower-left or upper-left diagonal direction from the pad terminal, and a second side surface of the pad terminal is located further to the left than a first side surface of a pad terminal located in the lower-right or upper-right diagonal direction from the pad terminal.

According to an embodiment, if the panel pad rows P_ROW are staggered, since a pad terminal of one pad row can overlap two closest pad terminals of an adjacent row, more panel pad terminals PE can be disposed overall.

However, embodiments of the present disclosure are not limited to the above case, and a pad terminal of one pad row may not overlap two closest pad terminals of an adjacent row. In other embodiments, a first side surface of the pad terminal is located further to the right than a second side surface of a pad terminal located in the lower-left and/or upper-left diagonal direction from the pad terminal, and a second side surface of the pad terminal is located further to the left than a first side surface of a pad terminal located in the lower-right and/or upper-right diagonal direction to the pad terminal.

Referring to FIGS. 2 and 4, according to an embodiment, the first circuit board 300 is disposed on the panel pad area P_PA. The first circuit board 300 is a flexible printed circuit film that includes a flexible material. The first circuit board 300 is connected to the panel pad area P_PA of the display panel 100 and is bent to cover a side surface of each of the display panel 100 and the under-panel sheet 200 and to overlap the lower surface of the under-panel sheet 200.

According to an embodiment, first circuit board 300 includes the first through fourth circuit areas CA1 through CA4.

According to an embodiment, the first circuit area CA1 is adjacent to the display area DA and overlaps the second panel pad area P_PA2. The second circuit area CA2 is located adjacent to the first circuit area CA1 and overlaps the first panel pad area P_PA1. The third circuit area CA3 is located adjacent to the second circuit area CA2. The third circuit area CA3 is an area of the first circuit board 300 that is bent to cover the side surface of each of the display panel 100 and the under-panel sheet 200. The fourth circuit area CA4 is located adjacent to the third circuit area CA3 and overlaps the circuit pad area C_PA.

According to an embodiment, the first circuit board 300 includes a first film 310, first through third lead terminals LE1 through LE3 disposed on a first surface of the first film 310, a second film 330 disposed on a second surface of the first film 310, fourth and fifth lead terminals LE4 and LE5 disposed on a first surface of the second film 330, and the data driver integrated circuit 390 disposed on the first surface of the first film 310.

According to an embodiment, the first circuit board 300 further includes an insulating layer 320 between the first film 310 and the second film 330.

According to an embodiment, the planar shape of the first circuit board 300 is determined by the planar outer profiles of the first film 310 and the second film 330. Therefore, the planar shape of the first circuit board 300 will be described along with the descriptions of the planar shapes of the first film 310 and the second film 330.

According to an embodiment, the first film 310 is disposed over the second through fourth circuit areas CA2 through CA4.

According to an embodiment, the first film 310 has long sides and short sides. For example, the first film 310 has long sides extending in the first direction DR1 and short sides extending in the second direction DR2. Alternatively, the first film 310 has short sides extending in the first direction DR1 and long sides extending in the second direction DR2. In an embodiment, the first film 310 has a rectangular planar shape. In other embodiments, the planar shape of the first film 310 may be a square, a circle, an ellipse, or other polygonal shapes.

According to an embodiment, contact holes CNT are included in the first film 310. These will be described below.

According to an embodiment, the first film 310 includes a ductile material such as polyethylene terephthalate (PET), polyimide (PI), polycarbonate (PC), polyethylene (PE), polypropylene (PP), polysulfone (PSF), polymethyl methacrylate (PMMA), triacetyl cellulose (TAC), or cyclo olefin polymer (COP).

According to an embodiment, the first through third lead terminals LE1 through LE3 are disposed on the first surface of the first film 310. The first and second lead terminals LE1 and LE2 are disposed in the second circuit area CA2. The first lead terminals LE1 are disposed adjacent to the third circuit area CA3 and coupled to the first panel pad terminals P_PE$_1$. The second lead terminals LE2 are disposed between the first circuit area CA1 and the first lead terminals LE1 and coupled to the second panel pad terminals P_PE$_2$. The third lead terminals LE3 are disposed in the fourth circuit area CA4 and coupled to the circuit pad terminals C_PE to be described below.

According to an embodiment, the first circuit board 300 further includes first signal wirings L1 and second signal wirings L2 disposed on the first surface of the first film 310. The first and second signal wirings L1 and L2 electrically connect the data driver integrated circuit 390 to the lead terminals LE1 through LE3. The first and second signal wirings L1 and L2 are physically connected to the data driver integrated circuit 390. The first signal wirings L1 are physically connected to the first and second lead terminals LE1 and LE2.

According to an embodiment, the data driver integrated circuit 390 is disposed on the first surface of the first film 310. The data driver integrated circuit 390 is electrically connected to the first through fifth lead terminals LE1 through LE5. In particular, the data driver integrated circuit 390 is electrically connected to the fourth and fifth lead terminals LE4 and L5 through the contact holes CNT formed in the first film 310 and the insulating layer 320. This arrangement will be described below.

According to an embodiment, the second film 330 is disposed on the second surface of the first film 310. The second film 330 overlaps the first film 310. The second film 330 is disposed over the first through fourth circuit areas CA1 through CA4.

According to an embodiment, like the first film 310, the second film 330 has long sides and short sides. For example, the second film 330 has long sides extending in the first direction DR1 and short sides extending in the second direction DR2. Alternatively, the second film 330 has short sides extending in the first direction DR1 and long sides extending in the second direction DR2. In an embodiment, the second film 330 has a rectangular planar shape. In other embodiments, the planar shape of the second film 330 may be a square, a circle, an ellipse, or other polygonal shapes.

In an embodiment, the short sides of the second film 330 are aligned with the short sides of the first film 310. In addition, a long side of the second film 330 on the side of the second circuit board 400 is aligned with a long side of the first film 310 on the side of the second circuit board 400. However, the other long side of the second film 330, on the side of the display area DA, protrudes further toward the display area DA than the other long side of the first film 310, on the side of the display area DA.

Therefore, according to an embodiment, in a plan view, an area on the other long side of the second film 330, on the side of the display area DA, protrudes further toward the display area DA than an area on the other long side of the first film 310, on the side of the display area DA.

In addition, according to an embodiment, since the planar shape of the first circuit board 300 is determined by the planar outer profiles of the first film 310 and the second film 330 as described above, it includes an area in which the first film 310 and the second film 330 overlap each other and an area in which the second film 330 protrudes further toward the display area DA than the first film 310.

According to an embodiment, the second film 330 is made of a material selected from the materials disclosed as examples of the material of the first film 310.

In the first circuit board 300 according to an embodiment, the second film 330 is disposed on the second surface of the first film 310, and a side surface of the second film 330 protrudes further toward the display area DA than a side surface of the first film 310. In the first circuit board 300, the lead terminals LE4 and LE5 are further disposed on a surface of the protruding area of the second film 330.

According to an embodiment, the fourth and fifth lead terminals LE4 and LE5 are disposed on the first surface of the second film 330. As described above, the area on the other long side of the second film 330, on the side of the display area DA, protrudes further toward the display area DA than the area on the other long side of the first film 310 on the side of the display area DA. The protruding area is the first circuit area CA1. The fourth and fifth lead terminals LE4 and LE5 are disposed in the first circuit area CA1. The fourth lead terminals LE4 are disposed adjacent to the second circuit area CA2 and coupled to the third panel pad terminals P_PE$_3$. The fifth lead terminals LE5 are disposed adjacent to the display area DA and coupled to the fourth panel pad terminals P_PE$_4$.

According to an embodiment, the first circuit board 300 further includes third signal wirings L3 disposed on the first surface of the second film 330. The third signal wirings L3 electrically connect the data driver integrated circuit 390 to the lead terminals LE4 and LE5. The third signal wirings L3 are physically connected to the data driver integrated circuit 390. The third signal wirings L3 are physically connected to the fourth and fifth lead terminals LE4 and LE5.

According to an embodiment, the first through fifth lead terminals LE1 through LE5 are arranged in the first direction DR1 to form rows. The first lead terminals LE1 form a first lead row L_ROW1, the second lead terminals LE2 form a second lead row L_ROW2, the third lead terminals LE3 form a third lead row L_ROW3, the fourth lead terminals LE4 form a fourth lead row L_ROW4, and the fifth lead terminals LE5 form a fifth lead row L_ROW5.

Specifically, according to an embodiment, the first lead row L_Row1 is disposed in the second circuit area CA2 adjacent to the third circuit area CA3 and corresponds to the first panel pad row P_ROW1. The second lead row L_ROW2 is disposed in the second circuit area CA2 between the first lead row L_ROW1 and the first circuit area CA1 and corresponds to the second panel pad row P_ROW2. The third lead row L_ROW3 is disposed in the fourth circuit area CA4 adjacent to the third circuit area CA3 and corresponds to a circuit pad row C_ROW to be described later. The fourth lead row L_ROW4 is disposed in the first circuit area CA1 adjacent to the second circuit area CA2 and corresponds to the third panel pad row P_ROW3. The fifth lead row L_ROW5 is disposed in the first circuit area CA1 adjacent to the display area DA and corresponds to the fourth panel pad area P_ROW4.

According to an embodiment, the lead rows L_ROW are staggered, like the panel pad rows P_ROW described above. The staggered arrangement described above in relation to the panel pad rows P_ROW is the same for the lead rows L_ROW. For example, the first and second lead rows L_ROW1 and L_ROW2 are staggered, and the fourth and fifth lead rows L_ROW4 and L_ROW5 are staggered.

According to an embodiment, if the lead rows L_ROW are staggered, since a lead terminal of one lead row can overlap two closest lead terminals of an adjacent row, more lead terminals LE can be arranged overall.

According to an embodiment, the insulating layer 320 is disposed between the first film 310 and the second film 330. The insulating layer 320 is disposed over the second through fourth circuit areas CA2 through CA4. The contact holes CNT extend through the first film 310 and the insulating layer 320.

According to an embodiment, the third signal wirings L3 are electrically connected to the data driver integrated circuit 390 through the contact holes CNT. The contact holes CNT overlap the data driver integrated circuit 390. The contact holes CNT extend from a surface of the data driver integrated circuit 390 in the thickness direction.

According to an embodiment, the contact holes CNT are not located in the same plane as the first signal wirings L1 and the second signal wirings L2. The contact holes CNT are arranged in the first direction DR1. Although the contact holes CNT are illustrated as forming one row in the drawings, embodiments of the present disclosure are not limited to this case. The contact holes CNT may also form a plurality of rows. In some embodiments, the contact holes CNT may be staggered.

According to an embodiment, as illustrated in the drawings, the contact holes CNT have a circular or elliptical planar shape. The planar width of the contact holes CNT is greater than that of the third signal wirings L3 connected through the contact holes CNT. For example, the widths of the contact holes CNT and the third signal wirings L3 are widths in the first direction DR1.

According to an embodiment, the insulating layer 320 insulates the first signal wirings L1 from the third signal wirings L3 in the second and third circuit areas CA2 and CA3. In addition, the insulating layer 320 insulates the first and second lead terminals LE1 and LE2 from the third signal wirings L3.

According to an embodiment, the insulating layer 320 may include, but is not limited to, a silicon oxide compound or a nitrogen oxide compound.

According to an embodiment, the insulating layer 320 is an insulating tape that has an insulating function. For example, the insulating tape includes a base, a first adhesive layer disposed on a surface of the base, and a second adhesive layer disposed on the other surface of the base. The first adhesive layer is attached onto the second surface of the first film 310. The second adhesive layer is attached to the first surface of the second film 330. The first and second adhesive layers include an insulating material. For example, the first and second adhesive layers are made of a material selected from the materials disclosed as examples of the material of the insulating layer 320. When the insulating tape is applied, the first adhesive layer, the base and the second adhesive layer include the contact holes CNT.

Referring to FIG. 2, according to an embodiment, a distance D1 between the second film 330 and the panel pad terminals P_PE in the first circuit area CA1 is greater than a distance D2 between the first film 310 and the panel pad terminals P_PE in the second circuit area CA2. According to an embodiment, a step difference due to the distances D1 and D2 can be compensated by adjusting the thicknesses of the lead terminals LE disposed on the first surfaces of the first film 310 and the second film 330.

For example, according to an embodiment, a thickness t1 of the fourth and fifth lead terminals LE4 and LE5 can be adjusted to be greater than a thickness t2 of the first and second lead terminals LE1 and LE2. In this case, the thickness t1 of the fourth and fifth lead terminals LE4 and LE5 is the sum of the thickness t2 of the first and second lead terminals LE1 and LE2, the thickness of the first film 310 and the thickness of the insulating layer 320.

According to an embodiment, if the thickness t1 of the fourth and fifth lead terminals LE4 and LE5 is adjusted to be the sum of the thickness t2 of the first and second lead terminals LE1 and LE2, the thickness of the first film 310 and the thickness of the insulating layer 320, a step difference between each of the first and second film 310 and 330 and the panel pad terminals P_PE can be compensated. Therefore, the second film 330 in the first circuit area CA1 and the first film 310 and the second film 330 in the second circuit area CA2 can be flat.

According to an embodiment, since the third signal wirings L3 are disposed on the first surface of the second film 330 of the first circuit area CA1 and the second circuit area CA2 as described above, if the second film 330 is flat in the first circuit area CA1 and the second circuit area CA2, disconnection due to bending or breaking of the third signal wirings L3 can be prevented.

As described above, the first circuit board 300 according to an embodiment has the second film 330 disposed on the second surface of the first film 310 and includes an area in which a side surface of the second film 330 protrudes further toward the display area DA than a side surface of the first film 310. In addition, the lead terminals LE4 and LE5 are further disposed on a surface of the protruding area of the first circuit board 300. The lead terminals LE4 and LE5 disposed in the protruding area each form at least two rows. The lead terminals LE4 and LE5 are bonded to the pad terminals P_PE$_3$ and P_PE$_4$, respectively. Accordingly, the first circuit board 300 according to an embodiment electrically connects multiple channels, such as the signal wirings L3, of the data driver integrated circuit 390 to the display panel 100. Since the first circuit board 300 according to an embodiment accommodates multiple channels of the data driver integrated circuit 390 and electrically connects the multiple channels to the display area DA of the display panel 100, the display device 1 can have a high resolution.

Likewise, according to an embodiment, since the first signal wirings L1 are disposed on the first surface of the first film 310 of the second circuit area CA2, if the first film 310 is flat in the second circuit area CA2, disconnection due to bending or breaking of the first signal wirings L1 can be prevented.

Referring to FIGS. 2 and 5, according to an embodiment, the second circuit board 400 is disposed on the fourth circuit area CA4. The second circuit board 400 overlaps the lower surface of the under-panel sheet 200.

According to an embodiment, the second circuit board 400 includes the circuit pad area C_PA. The circuit pad area C_PA overlaps the fourth circuit area CA4.

According to an embodiment, the second circuit board 400 includes a first substrate 401 and the circuit pad terminals C_PE disposed on a surface of the first substrate 401.

According to an embodiment, the first substrate 401 is a rigid substrate made of glass or quartz.

According to an embodiment, in the second circuit board 400, the circuit pad terminals C_PE are disposed on the surface of the first substrate 401. The circuit pad terminals C_PE are disposed in the circuit pad area C_PA.

According to an embodiment, the circuit pad terminals C_PE are coupled to the third lead terminals LE3.

According to an embodiment, the circuit pad terminals C_PE are arranged in the first direction to form a row. The circuit pad terminals C_PE form the circuit pad row C_ROW. Specifically, the circuit pad row C_ROW corresponds to the third lead row L_ROW3.

Hereinbelow, display devices according to other embodiments will be described. In the following embodiments, elements identical to those of the above-described embodiment may be indicated by the same reference numerals, and a repeated description of the elements will be omitted or given briefly.

Figure 6:
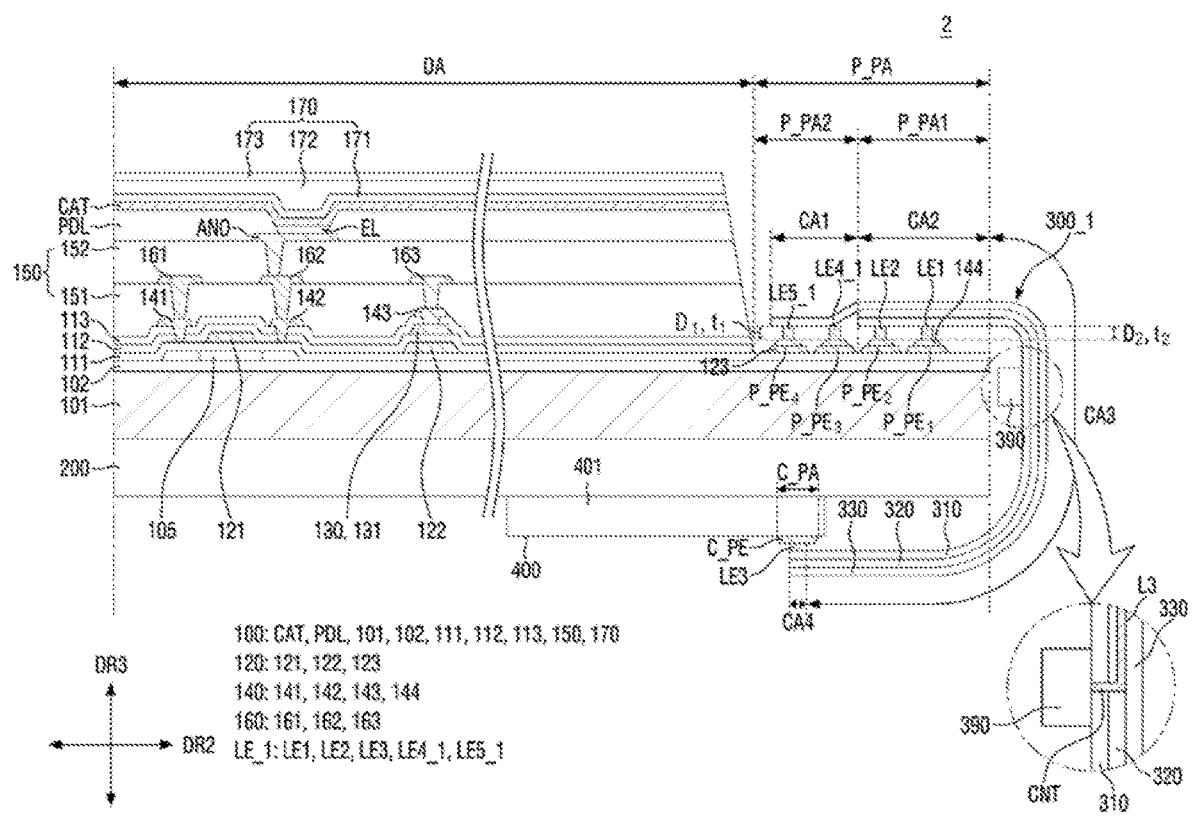
FIG. 6 is a cross-sectional view of a display device according to an embodiment.

FIG. 6 is a cross-sectional view of a display device 2 according to an embodiment.

Referring to FIG. 6, the display device 2 according to a current embodiment differs from the display device 1 according to an embodiment of FIGS. 1 through 5 in that the thicknesses of a fifth lead terminal LE5_1 and a fourth lead terminal LE4_1 are the same as the thicknesses of a first lead terminal LE1_1 and a second lead terminal LE2_1.

According to an embodiment, a first film 310 and a second film 330 have a step difference corresponding to the thickness of the first film 310 as described above. If the thicknesses of the fifth lead terminal LE5_1 and the fourth lead terminal LE4_1 are the same as the thicknesses of the first lead terminal LE1_1 and the second lead terminal LE2_1, the second film 330 has a non-flat area when the fifth lead terminal LE5_1 and the fourth lead terminal LE4_1 are coupled to panel pad terminals P_PE$_3$ and P_PE$_4$ in a first circuit area CAL The non-flat area is located between the second lead terminal LE2 and the fifth lead terminal LE5_1. The non-flat area is inclined between the second lead terminal LE2 and the fifth lead terminal LE5_1.

Figure 7:
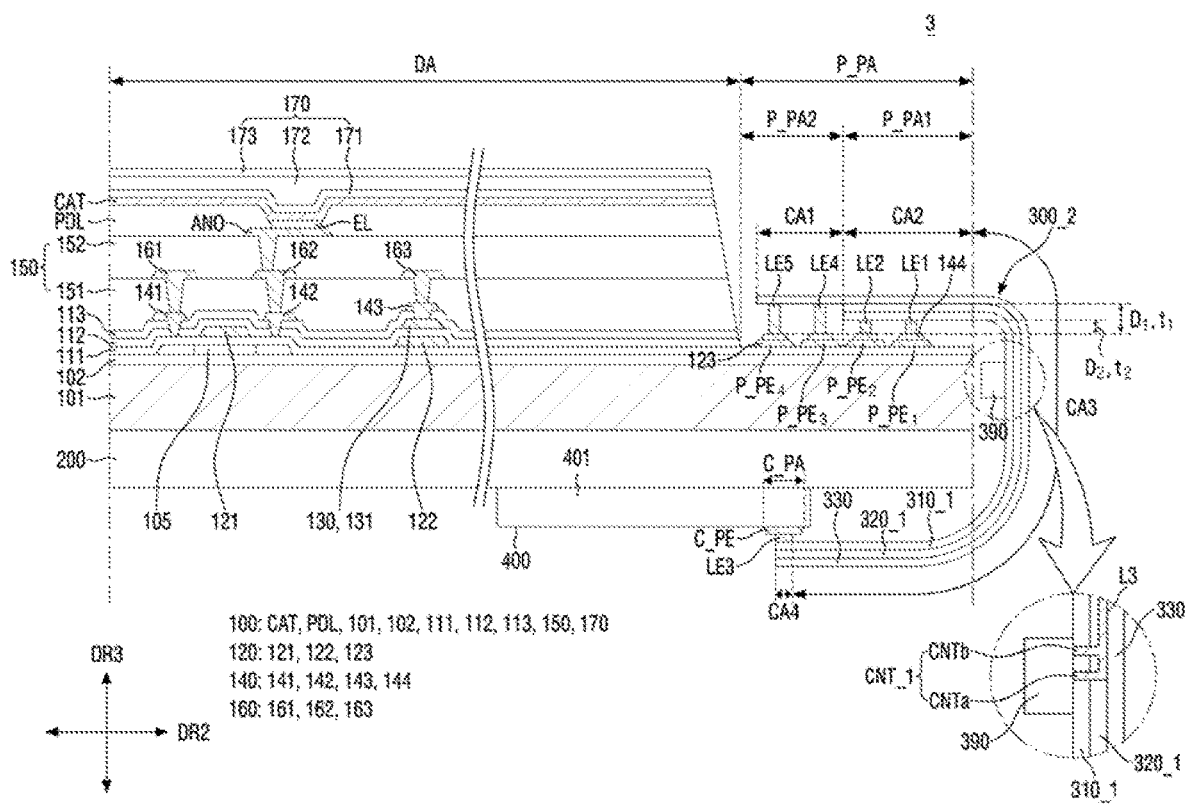
FIG. 7 is a cross-sectional view of a display device according to an embodiment.
Figure 8:
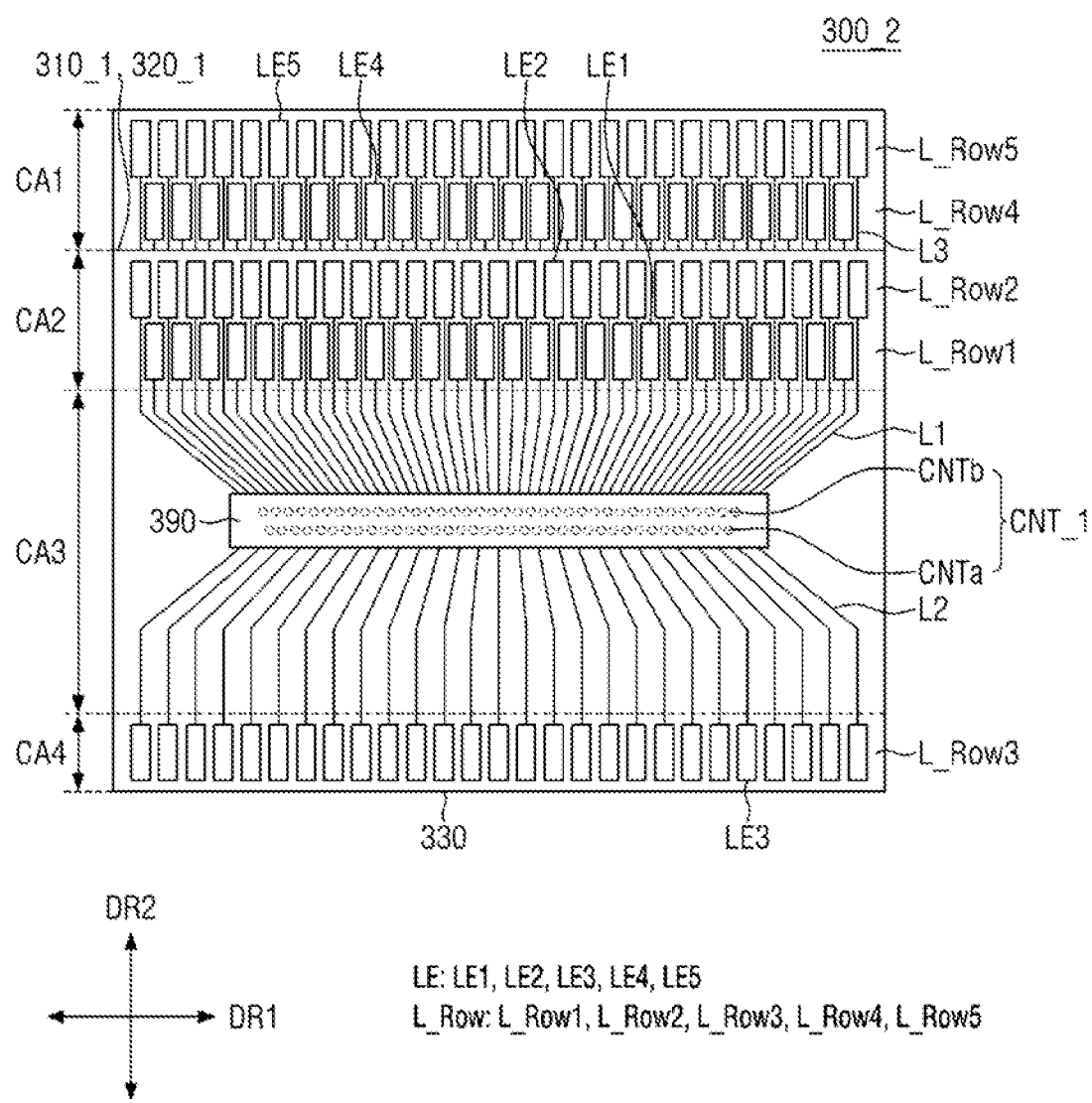
FIG. 8 is a plan layout view of a first circuit board according to an embodiment.

FIG. 7 is a cross-sectional view of a display device 3 according to an embodiment. FIG. 8 is a plan layout view of a first circuit board 300_1 according to an embodiment.

Referring to FIGS. 7 and 8, the display device 3 according to a current embodiment differs from the display device 1 according to an embodiment of FIGS. 1 through 5 in that contact holes CNT_1 are staggered. Although the contact holes CNT_1 are illustrated as forming two rows in the drawings, embodiments of the present disclosure are not limited to this case. The contact holes CNT_1 may form more than two rows.

As described above, according to an embodiment, the width of the contact holes CNT_1 is greater than that of third signal wirings L3. If the contact holes CNT_1 are staggered as in a current embodiment, more contact holes CNT_1 can be placed as compared with when the contact holes CNT_1 are arranged side by side in a direction. Accordingly, the display device 3 can accommodate more signals of a data driver integrated circuit 390 through an increased number of contact holes CNT_1.

Therefore, the first circuit substrate 300_2 according to a current embodiment can accommodate multiple channels of the data driver integrated circuit 390 and electrically connect the multiple channels to a display area DA of a display panel 100. As a result, the display device 3 can have a high resolution.

Figure 9:
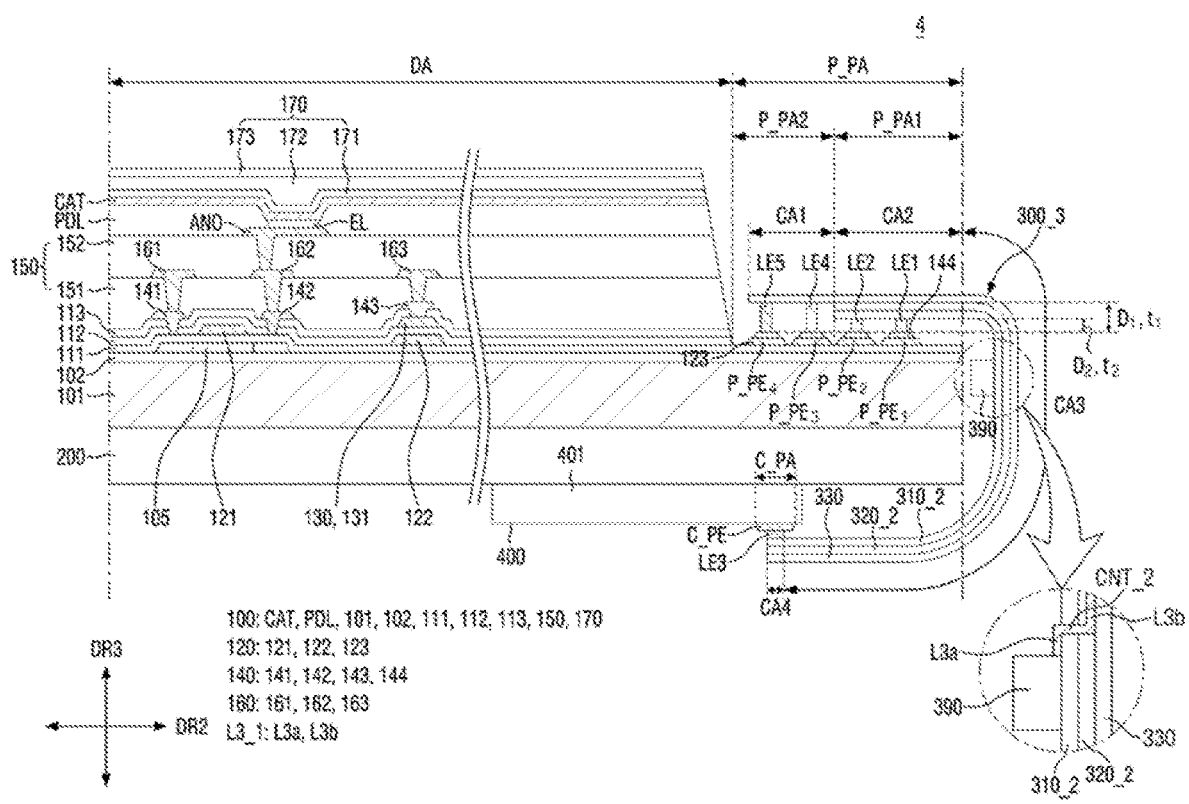
FIG. 9 is a cross-sectional view of a display device according to an embodiment.
Figure 10:
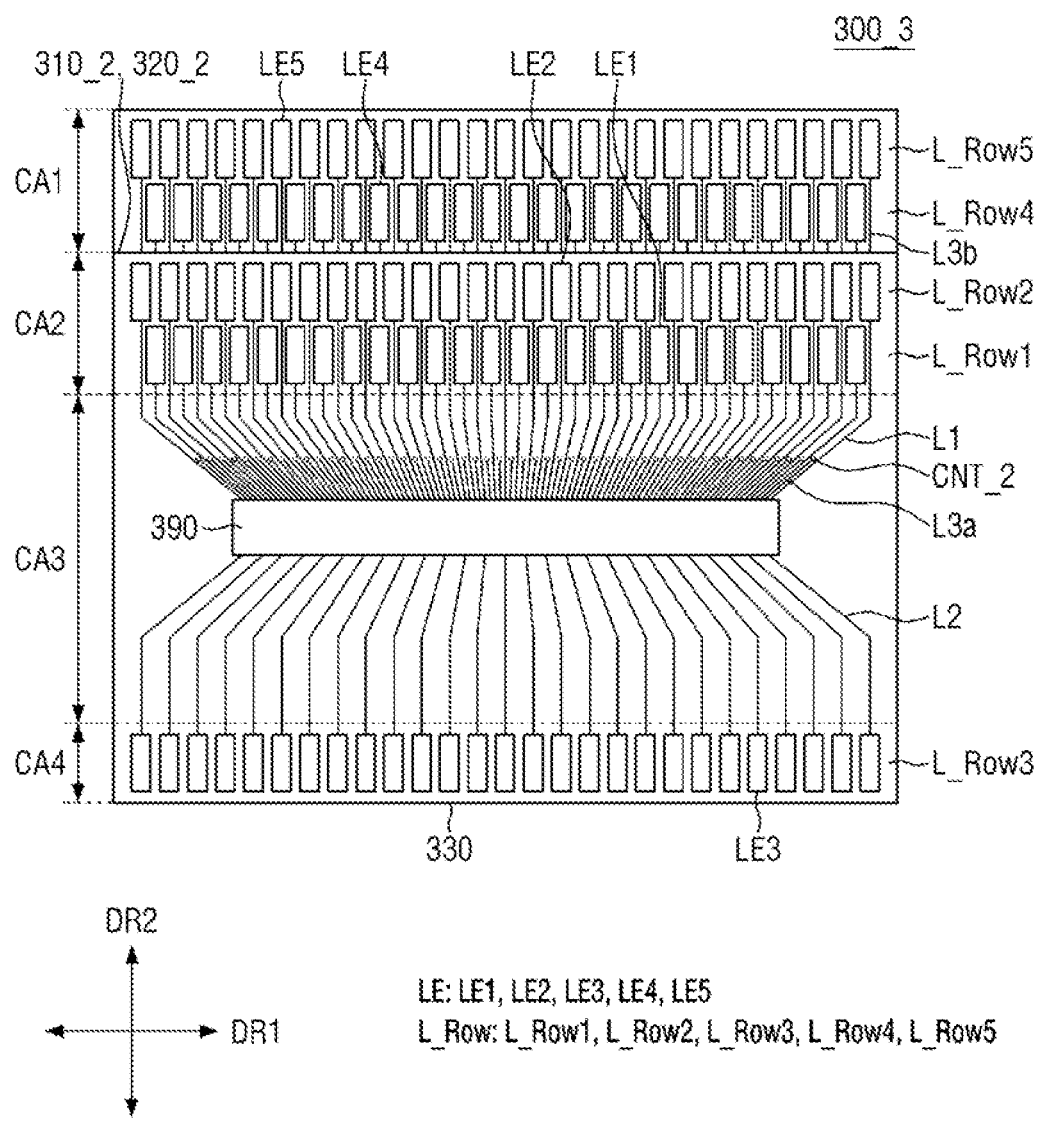
FIG. 10 is a plan layout view of a first circuit board according to an embodiment.

FIG. 9 is a cross-sectional view of a display device 4 according to an embodiment. FIG. 10 is a plan layout view of a first circuit board 300_3 according to an embodiment.

Referring to FIGS. 9 and 10, the display device 4 according to a current embodiment differs from the display device 1 according to an embodiment of FIGS. 1 through 5 in that contact holes CNT_2 are disposed between a data driver integrated circuit 390 and a second circuit area CA2.

More specifically, according to an embodiment, the contact holes CNT_2 are disposed in the third circuit area between the data driver integrated circuit 390 and the second circuit area CA2. Third signal wirings L3_1 include first sub-signal wirings L3a and second sub-signal wirings L3b. The first sub-signal wirings L3a are disposed on a surface of a first film 310_2. The first sub-signal wirings L3a lie in the same plane as first signal wirings L1. The first sub-signal wirings L3a are physically connected to the data driver integrated circuit 390. The first sub-signal wirings L3a are physically connected through the contact holes CNT_2. The second sub-signal wirings L3b are disposed on a surface of a second of a second film 330. The first sub-signal wirings L3a and the second sub-signal wirings L3b are connected through the contact holes CNT_2. The second sub-signal wirings L3b are connected to fourth and fifth lead terminals LE4 and LE5. That is, the fourth and fifth lead terminals LE4 and LE5 are electrically connected to the data driver integrated circuit 390 through the first sub-signal wirings L3a, the second sub-signal wirings L3b, and the contact holes CNT_2.

According to an embodiment, the planar width of the contact holes CNT_2 is greater than those of the first sub-signal wirings L3a and the second sub-signal wirings L3b.

Figure 11:
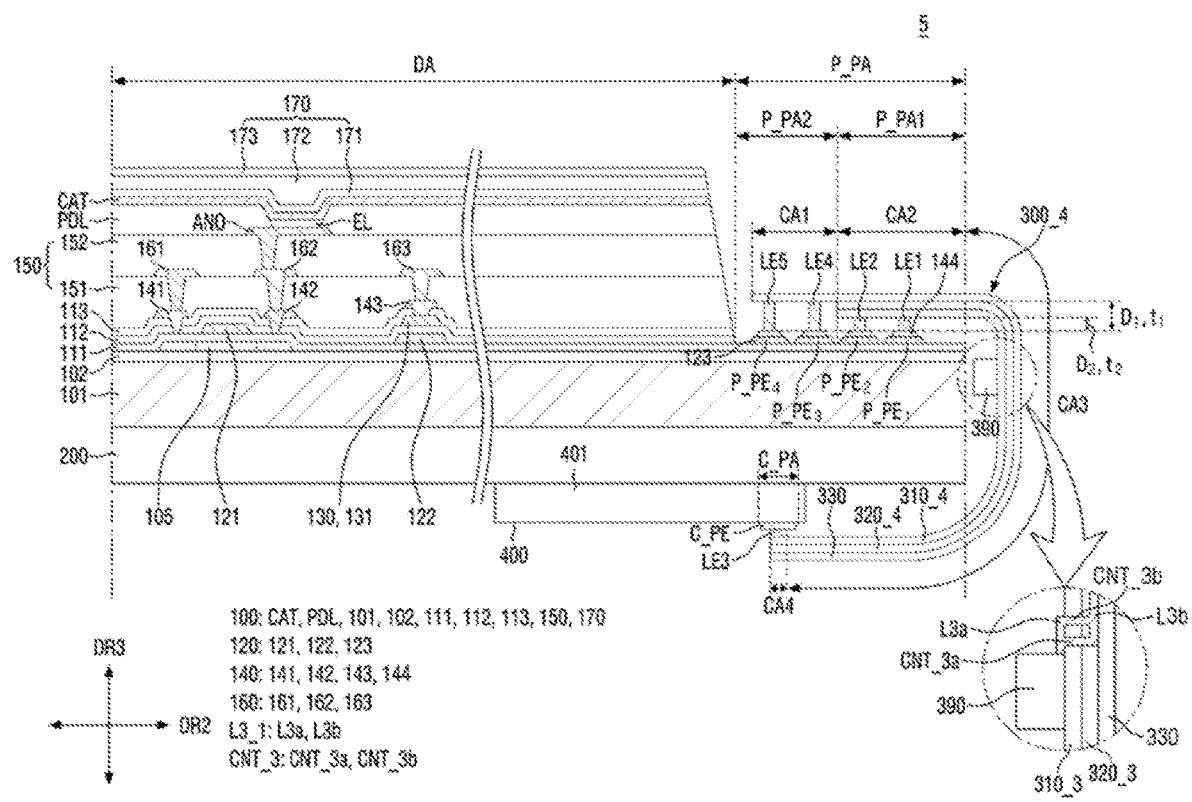
FIG. 11 is a cross-sectional view of a display device according to an embodiment.
Figure 12:
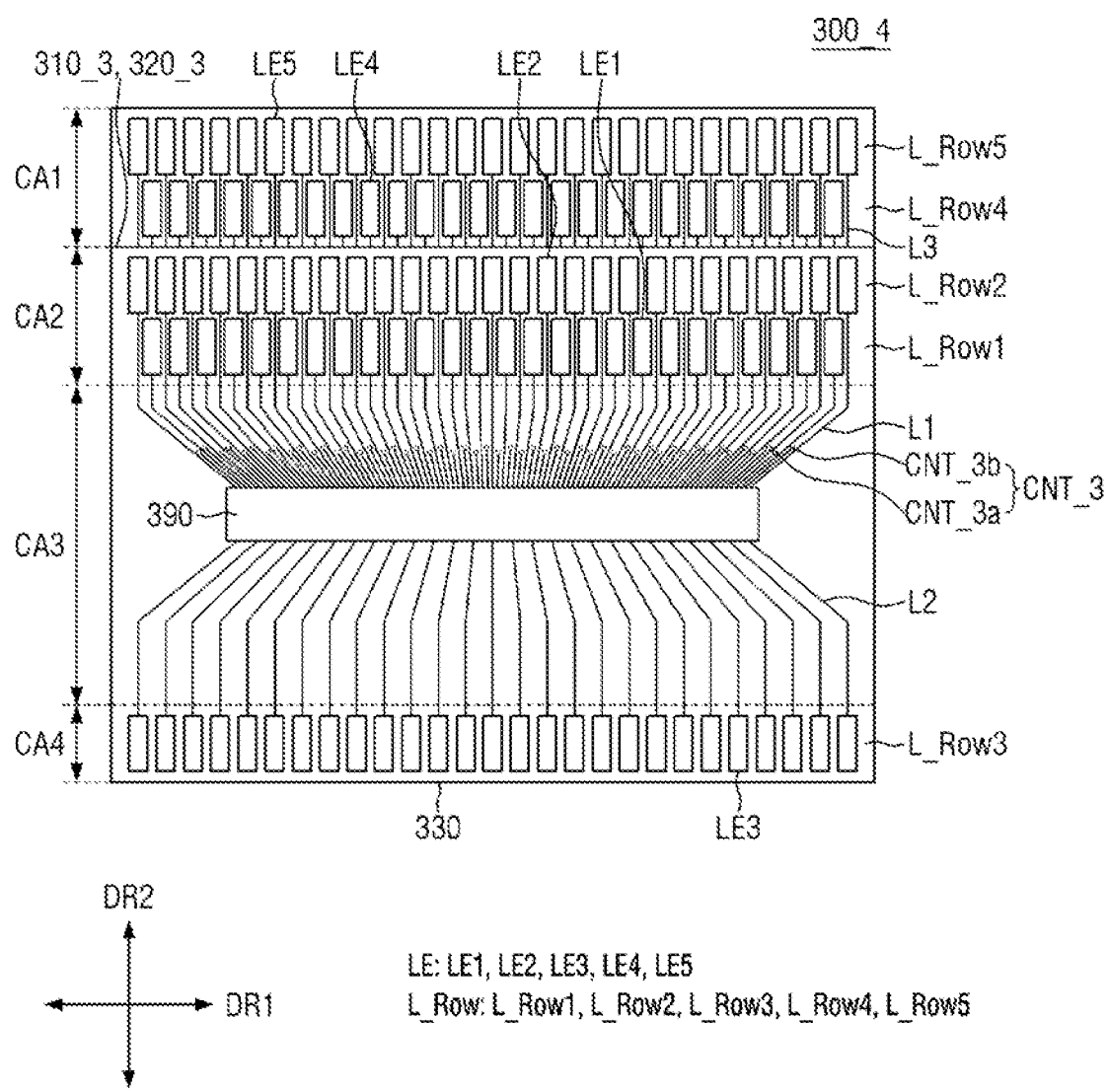
FIG. 12 is a plan layout view of a first circuit board according to an embodiment.

FIG. 11 is a cross-sectional view of a display device 5 according to an embodiment. FIG. 12 is a plan layout view of a first circuit board 300_4 according to an embodiment.

Referring to FIGS. 11 and 12, the display device 5 according to a current embodiment differs from the display device 4 according to an embodiment of FIG. 9 in that contact holes CNT_3 are staggered. Although the contact holes CNT_3 are illustrated as forming two rows in the drawings, embodiments of the present disclosure are not limited to this case. The contact holes CNT_3 may form more than two rows.

According to an embodiment, the planar width of the contact holes CNT_3 is greater than those of first sub-signal wirings L3a and second sub-signal wirings L3b. If the contact holes CNT_3 are staggered as in a current embodiment, more contact holes CNT_3 can be placed as compared with when the contact holes CNT_3 are arranged side by side in a direction. Accordingly, the display device 5 can accommodate more signals of a data driver integrated circuit 390 through an increased number of contact holes CNT_3.

Figure 13:
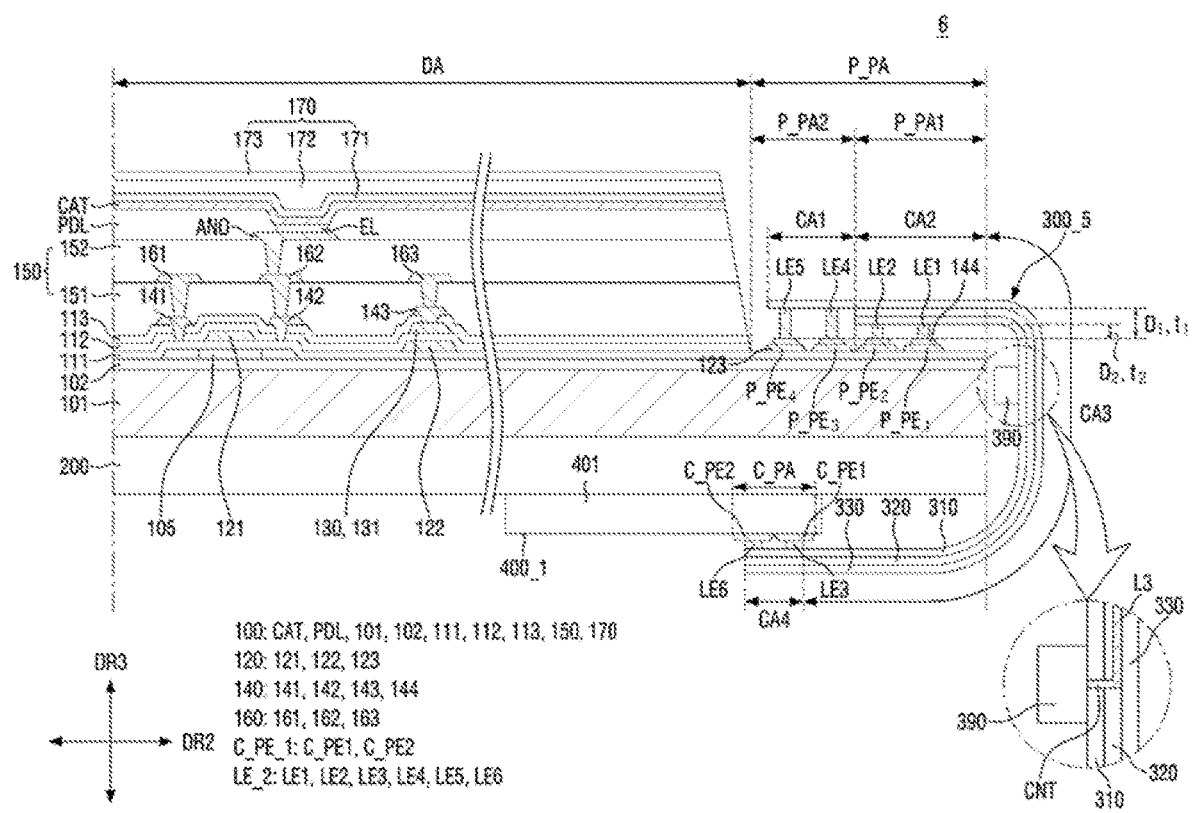
FIG. 13 is a cross-sectional view of a display device according to an embodiment.
Figure 14:
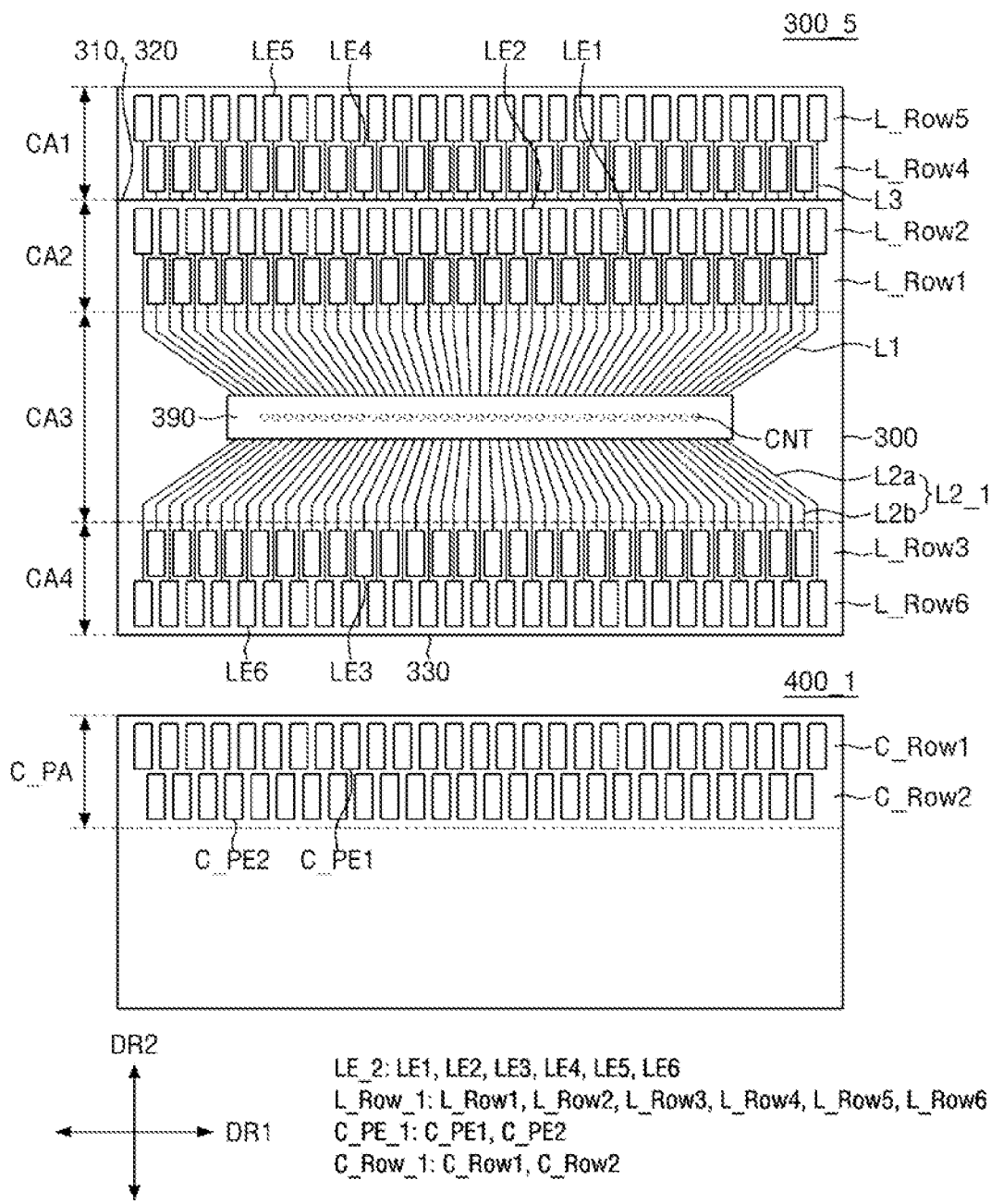
FIG. 14 is a plan layout view of first and second circuit boards according to an embodiment.

FIG. 13 is a cross-sectional view of a display device 6 according to an embodiment. FIG. 14 is a plan layout view of first and second circuit boards 300_5 and 400_1 according to an embodiment.

Referring to FIGS. 13 and 14, the display device 6 according to a current embodiment differs from the display device 1 according to an embodiment of FIGS. 1 through 5 in that it further includes sixth lead terminals LE6 disposed at an end of the first circuit board 300_5 in a fourth circuit area CA4 and second circuit pad terminals C_PE2 disposed at an end of the second circuit board 400_1 in a circuit pad area C_PA, in addition to the third lead terminals LE3 and first circuit pad terminals C_PE1

More specifically, according to an embodiment, the sixth lead terminals LE6 are disposed on a surface of the fourth circuit area CA4 of a first film 310. The sixth lead terminals LE6 are arranged in the first direction DR1 to form a row. The sixth lead terminals LE6 form a sixth lead row L_ROW6.

According to an embodiment, the sixth lead row L_ROW6 and a third lead row L_ROW3 are staggered.

According to an embodiment, the second circuit pad terminals C_PE2 are disposed at an end of the second circuit board 400_1. The second circuit pad terminals C_PE2 are coupled to the sixth lead terminals LE6. The second circuit pad terminals C_PE2 are arranged in the first direction DR1 to form a row. The second circuit pad terminals C_PE2 may form a second circuit pad row C_ROW2, in addition to the first circuit pad row C_ROW1 formed from the first circuit pad terminals C_PE1. The second circuit pad row C_ROW2 corresponds to the sixth lead row L_ROW6.

According to an embodiment, the first circuit pad row C_ROW1 and the second circuit pad row C_ROW2 are staggered.

Figure 15:
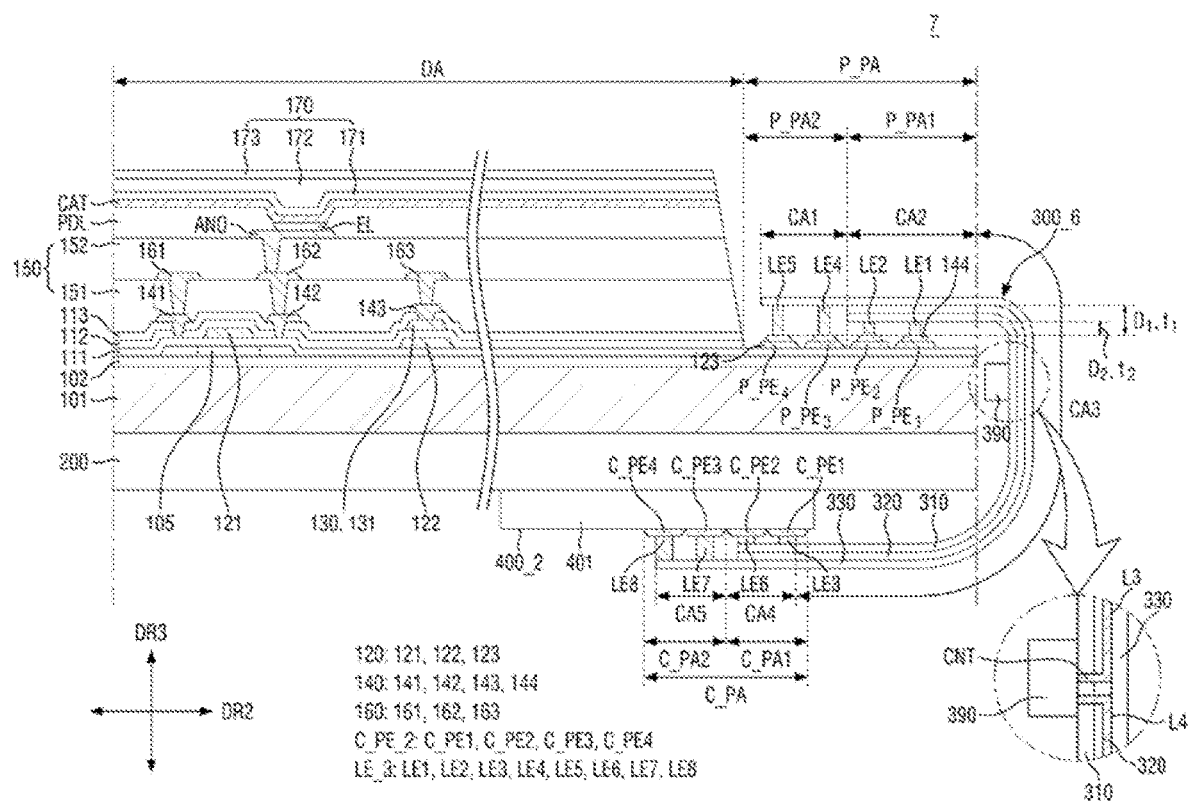
FIG. 15 is a cross-sectional view of a display device according to an embodiment.
Figure 16:
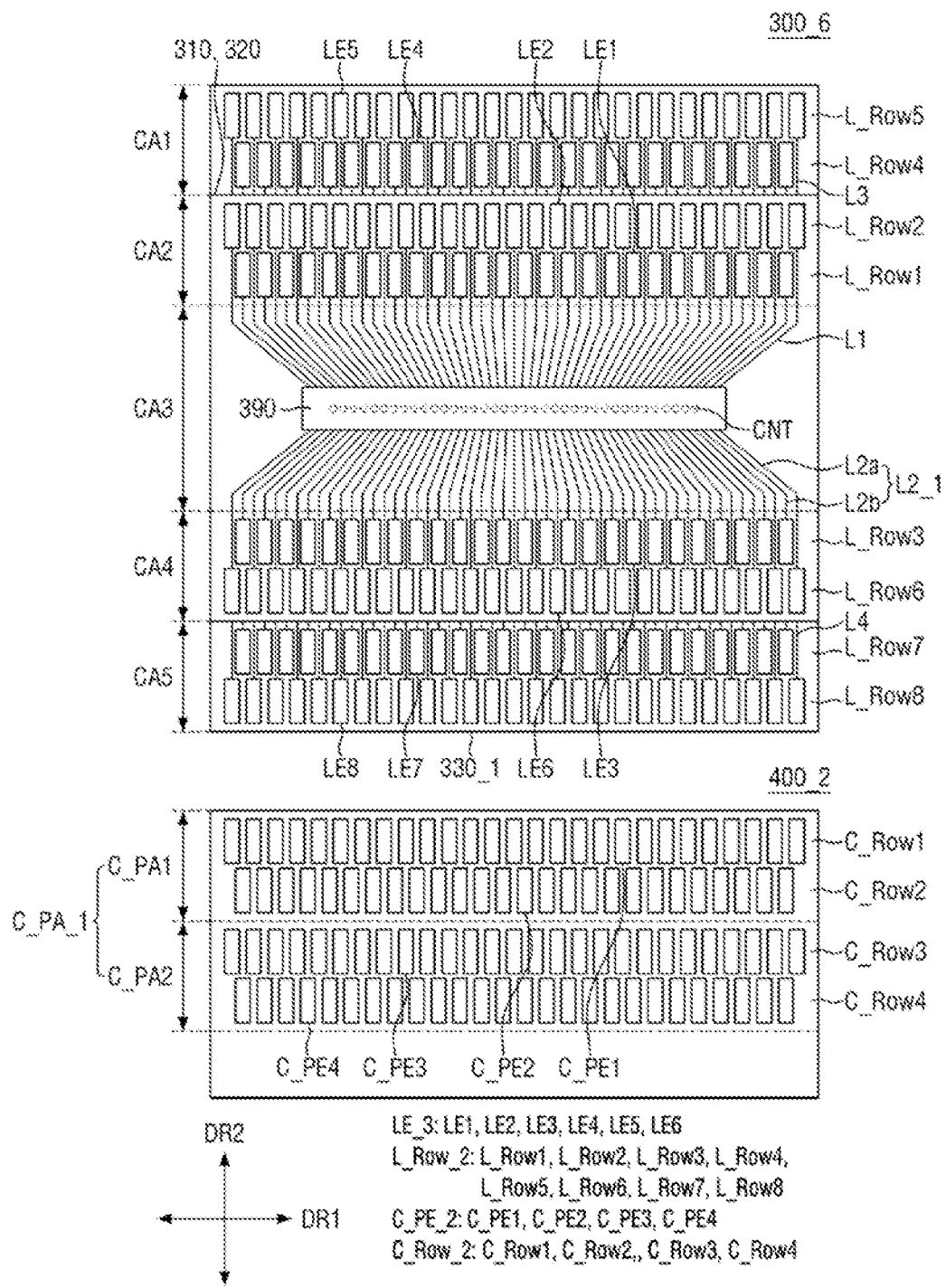
FIG. 16 is a plan layout view of first and second circuit boards according to an embodiment.

FIG. 15 is a cross-sectional view of a display device 7 according to an embodiment. FIG. 16 is a plan layout view of first and second circuit boards 300_6 and 400_2 according to an embodiment.

Referring to FIGS. 15 and 16, a display device 7 according to a current embodiment differs from embodiments of FIGS. 11 through 13 in that the first circuit board 300_6 further includes a fifth circuit area CA5 that extends outward from a fourth circuit area CA4 and seventh lead terminals LE7 and eighth lead terminals LE8 disposed in the fifth circuit area CA5 of a second film 330.

More specifically, according to an embodiment, the second film 330 extends outward in the second direction DR2 from a first film 310. The extended area is the fifth circuit area CA5. The seventh lead terminals LE7 and the eighth lead terminals LE8 are disposed in the extended area. The seventh lead terminals LE7 may be disposed adjacent to the fourth circuit area CA4. The eighth lead terminals LE8 are disposed adjacent to an end of the first circuit board 300_6.

According to an embodiment, the seventh lead terminals LE7 and the eighth lead terminals LE8 are arranged in the first direction DR1 to form rows. The seventh lead terminals LE7 form a seventh lead row L_ROW7. The eighth lead terminals LE8 form an eighth lead row L_ROW8.

According to an embodiment, the seventh lead row L_ROW7 and the eighth lead row L_ROW8 are staggered.

According to an embodiment, the first circuit board 300_6 further includes fourth signal wirings L4 disposed on a surface of the second film 330. The fourth signal wirings L4 electrically connect a data driver integrated circuit 390 to the lead terminals LE7 and LE8. The fourth signal wirings L4 are physically connected to the data driver integrated circuit 390. The fourth signal wirings LA are physically connected to the seventh and eighth lead terminals LE7 and LE8. The fourth signal wirings L4 are connected to contact holes CNT disposed under the data driver integrated circuit 390.

According to an embodiment, an insulating layer 320 insulates second signal wirings L2_1 from the fourth signal wirings L4 in the fourth circuit area CA4. In addition, the insulating layer 320 insulates third and sixth lead terminals LE3 and LE6 from the fourth signal wirings L4.

According to an embodiment, a distance D3 between the second film 330 and circuit pad terminals C_PE3 and C_PE4 in the fifth circuit area CA5 is greater than a distance D4 between the first film 310 and circuit pad terminals C_PE1 and C_PE2 in the fourth circuit area CA4. According to an embodiment, a step difference due to the distances D3 and D4 can be compensated by adjusting the thickness of the lead terminals LE disposed on surfaces of the first film 310 and the second film 330.

For example, according to an embodiment, a thickness t3 of the seventh and eighth lead terminals LE7 and LE8 can be adjusted to be greater than a thickness t4 of the third and sixth lead terminals LE3 and LE6. In this case, the thickness t3 of the seventh and eighth lead terminals LE7 and LE8 is the sum of the thickness t4 of the third and sixth lead terminals LE3 and LE6, the thickness of the first film 310 and the thickness of the insulating layer 320.

According to an embodiment, if the thickness t1 of the seventh and eighth lead terminals LE7 and LE8 is adjusted to be the sum of the thickness t2 of the third and sixth lead terminals LE3 and LE6, the thickness of the first film 310 and the thickness of the insulating layer 320, a step difference between each of the first and second film 310 and 330 and the circuit pad terminals C_PE can be compensated. Therefore, the second film 330 in the fifth circuit area CA5 and the first film 310 and the second film 330 in the fourth circuit area CA4 are flat. Since the fourth signal wirings L4 are disposed on the surface of the second film 330 in the fourth circuit area CA4 and the fifth circuit area CA5 as described above, if the second film 330 is flat in the fourth circuit area CA4 and the fifth circuit area CA5, disconnection due bending or breaking of the fourth signal wirings L4 can be prevented.

Likewise, according to an embodiment, since the second signal wirings L2_1 are disposed on the surface of the first film 310 in the fourth circuit area CA4, if the first film 310 is flat in the fourth circuit area CA4, disconnection due to bending or breaking of the second signal wirings L2_1 can be prevented.

Figure 17:
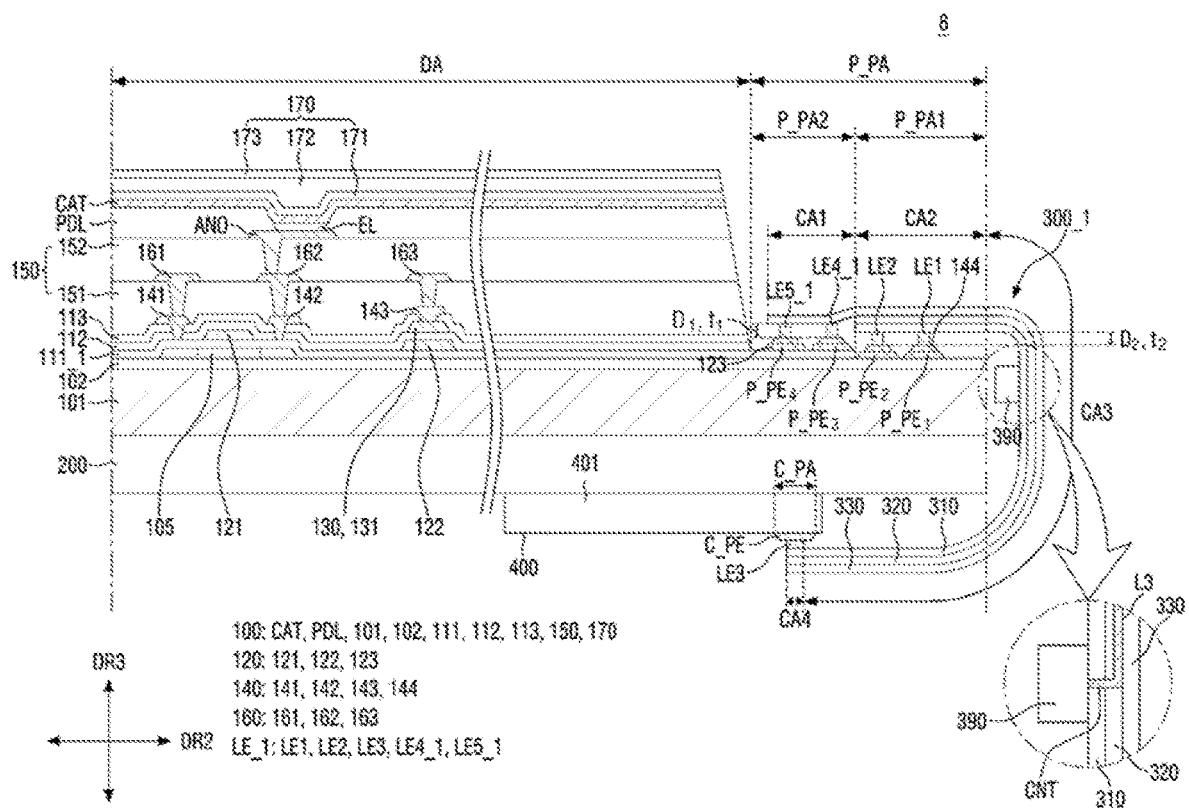
FIG. 17 is a cross-sectional view of a display device according to an embodiment.

FIG. 17 is a cross-sectional view of a display device 8 according to an embodiment.

Referring to FIG. 17, the display device 8 according to a current embodiment differs from the display device 2 according to an embodiment of FIG. 6 in that a first insulating layer 111_1 is removed from a first panel pad area P_PA1.

More specifically, according to an embodiment, the first insulating layer 111_1 is removed from the first panel pad area P_PA1 by a predetermined thickness to expose a buffer layer 102. The thickness by which the first insulating layer 111_1 is removed corresponds to a step difference between a first film 310 and a second film 330 in a first circuit area CA1, that is, the thickness of the first film 310. Thus, a first circuit board 300_1 shrinks in the thickness direction in the first panel pad area P_PA1 or a second circuit area CA2. Accordingly, as the above-described non-flat area shrinks in the thickness direction, the inclination of the non-flat area in the first and second circuit areas CA1 and CA2 is somewhat reduced.

According to an embodiment, not only the first insulating layer 111_1 but also the buffer layer 102 can be removed from the first panel pad area P_PA1 to expose a base substrate 101.

According to an embodiment, a flexible printed circuit board is provided that includes a first film and a second film disposed on a surface of the first film and that has a portion protruding further than a side of the first film, and at least two rows of lead terminals are disposed in the protruding portion.

Therefore, multiple channels of a data driver integrated circuit can be accommodated.

However, effects of embodiments are not restricted to those set forth herein. The above and other effects of exemplary embodiments will become more apparent to one of daily skill in the art to which exemplary embodiments pertain by referencing the claims.

What is claimed is:

1. A display device, comprising:
a display panel that comprises a display area and a pad terminal area disposed adjacent to the display area; and
a first circuit board that is attached to the pad terminal area of the display panel, wherein
the first circuit board comprises a first film that has at least one first lead terminal row in which one or more first lead terminals are arranged along the first direction and a second film that has at least one second lead terminal row in which one or more second lead terminals are arranged along the first direction,
the pad terminal area comprises a first pad terminal area that has at least one first pad terminal row in which one or more first pad terminals are arranged along a first direction and a second pad terminal area that has at least one second pad terminal row in which one or more second pad terminals are arranged along the first direction, wherein
the first pad terminal row comprises a first sub-pad terminal row and a second sub-pad terminal row which are spaced apart from each other in a second direction intersecting the first direction,
the second pad terminal row comprises a third sub-pad terminal row and a fourth sub-pad terminal row which are spaced apart from each other in the second direction,
the first lead terminals are connected to the first pad terminals,
the second lead terminals are connected to the second pad terminals,
a first end of the second film protrudes from a first end of the first film toward the display area, and
the second pad terminal area overlaps an area between the first end of the first film and the first end of the second film,
the first pad terminals of the first sub-pad terminal row and the second sub-pad terminal row are staggered, wherein a first pad terminal of one sub-pad terminal row overlaps two closest first pad terminals of an adjacent sub-pad terminal row, and
the second pad terminals of the third sub-pad terminal row and the fourth sub-pad terminal row are staggered, wherein a second pad terminal of one sub-pad terminal row overlaps two closest second pad terminals of an adjacent sub-pad terminal row,
the first circuit board further comprises an insulating layer disposed between the first film and the second film, and contact holes that penetrate through the first film and the insulating layer, and
the contact holes overlap the driver integrated circuit.

2. The display device of claim 1, wherein
the first lead terminal row comprises a first sub-lead terminal row and a second sub-lead terminal row which are spaced apart from each other in the second direction, and
the second lead terminal row comprises a third sub-lead terminal row and a fourth sub-lead terminal row which are spaced apart from each other in the second direction, wherein
the first lead terminals of the first sub-lead terminal row and the second sub-lead terminal row are staggered, wherein a first lead terminal of one sub-lead terminal row overlaps two closest first lead terminals of an adjacent sub-lead terminal row, and
the second lead terminals of the third sub-lead terminal, row and the fourth sub-lead terminal row are staggered, wherein a second lead terminal of one sub-lead terminal row overlaps two closest second lead terminals of an adjacent sub-lead terminal row.

3. The display device of claim 1, wherein the first circuit board further comprises a driver integrated circuit disposed on a first surface of the first film.

4. The display device of claim 3, wherein the first circuit board further comprises first signal wirings disposed on the first surface of the first film and that connect the driver integrated circuit to the first lead terminals.

5. The display device of claim 4, wherein
the second lead terminals are disposed on a first surface of the second film, and
the insulating layer is disposed between a second surface of the first film and the first surface of the second film.

6. The display device of claim 5, wherein
the first circuit board further comprises second signal wirings disposed on the first surface of the second film and that connect the contact holes to the second lead terminals.

7. The display device of claim 6, wherein the second signal wirings are disposed in a different plane from the first signal wirings.

8. The display device of claim 7, wherein the second signal wirings are insulated from the first lead terminals and the first signal wirings by the insulating layer.

9. The display device of claim 6, wherein
the contact holes form a plurality of rows on the first circuit board, and
the contact holes in different rows are staggered.

10. The display device of claim 1, wherein
a thickness of each of the one or more first lead terminals is thinner than a thickness of each of the one or more second lead terminals.

* * * * *